US008154922B2

(12) United States Patent
Tanaka et al.

(10) Patent No.: US 8,154,922 B2
(45) Date of Patent: Apr. 10, 2012

(54) SEMICONDUCTOR MEMORY DEVICE

(75) Inventors: Tomoharu Tanaka, Yokohama (JP);
Hiroshi Nakamura, Kawasaki (JP);
Toru Tanzawa, Ebina (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/100,020

(22) Filed: May 3, 2011

(65) Prior Publication Data

US 2011/0222343 A1 Sep. 15, 2011

Related U.S. Application Data

(60) Continuation of application No. 12/363,203, filed on Jan. 30, 2009, which is a continuation of application No. 12/040,457, filed on Feb. 29, 2008, now Pat. No. 7,649,780, which is a continuation of application No. 11/313,826, filed on Dec. 22, 2005, now Pat. No. 7,349,259, which is a continuation of application No. 11/055,655, filed on Feb. 11, 2005, now Pat. No. 7,061,807, which is a continuation of application No. 10/622,744, filed on Jul. 21, 2003, now Pat. No. 6,868,013, which is a continuation of application No. 10/315,030, filed on Dec. 10, 2002, now Pat. No. 6,621,738, which is a continuation of application No. 10/024,189, filed on Dec. 21, 2001, now Pat. No. 6,525,964, which is a continuation of application No. 09/768,588, filed on Jan. 25, 2001, now Pat. No. 6,344,996, which is a division of application No. 09/504,903, filed on Feb. 16, 2000, now Pat. No. 6,208,573, which is a division of application No. 09/055,216, filed on Apr. 6, 1998, now Pat. No. 6,064,611.

(30) Foreign Application Priority Data

Apr. 7, 1997 (JP) ...................................... 9-087983

(51) Int. Cl.
*G11C 11/34* (2006.01)
(52) U.S. Cl. .............................. 365/185.03; 365/185.18
(58) Field of Classification Search .............. 365/185.03
See application file for complete search history.

(56) References Cited

U.S. PATENT DOCUMENTS 4,788,665 A 11/1988 Fukuda et al.
(Continued)

FOREIGN PATENT DOCUMENTS

JP 07-230695 8/1995
(Continued)

OTHER PUBLICATIONS

Tae-Sung Jung et al.; "A3,3V 128 Mb Multi-Level NAND Flash Memory for Mass Storage Applications," ISSCC Digest of Technical Papers, pp. 32-33, Feb. 1996.

(Continued)

*Primary Examiner* — Son Dinh
(74) *Attorney, Agent, or Firm* — Banner & Witcoff, Ltd.

(57) ABSTRACT

A semiconductor memory device comprises memory cells, a bitline connected to the memory cells, a read circuit including a precharge circuit, and a first transistor connected between the bitline and the read circuit, wherein a first voltage is applied to a gate of the first transistor when the precharge circuit precharges the bitline, and a second voltage which is different from the first voltage is applied to the gate of the first transistor when the read circuit senses a change in a voltage of the bitline.

30 Claims, 14 Drawing Sheets

U.S. PATENT DOCUMENTS

| | | |
|---|---|---|
| 5,299,162 A | 3/1994 | Kim et al. |
| 5,345,418 A | 9/1994 | Challa |
| 5,481,493 A * | 1/1996 | Bergemont ............ 365/185.18 |
| 5,519,660 A | 5/1996 | Iwahashi |
| 5,539,690 A | 7/1996 | Taireja et al. |
| 5,561,620 A | 10/1996 | Chen et al. |
| 5,570,315 A | 10/1996 | Tanaka et al. |
| 5,583,808 A * | 12/1996 | Brahmbhatt ............ 365/185.05 |
| 5,596,526 A | 1/1997 | Assar et al. |
| 5,617,368 A | 4/1997 | Ishida |
| 5,657,270 A * | 8/1997 | Ohuchi et al. ............ 365/185.22 |
| 5,751,637 A | 5/1998 | Chen et al. |
| 5,757,699 A | 5/1998 | Takeshima et al. |
| 5,826,600 A | 10/1998 | Rowe et al. |
| 5,847,992 A | 12/1998 | Tanaka et al. |
| 5,892,710 A | 4/1999 | Fazio et al. |
| 5,892,722 A | 4/1999 | Jang et al. |
| 5,896,328 A | 4/1999 | Tanizaki et al. |
| 5,917,767 A | 6/1999 | Ohta |
| 5,977,584 A | 11/1999 | Kim |
| 6,028,792 A | 2/2000 | Tanaka et al. |
| 6,064,611 A | 5/2000 | Tanaka et al. |
| 6,163,048 A | 12/2000 | Hirose et al. |
| 6,208,573 B1 | 3/2001 | Tanaka et al. |

FOREIGN PATENT DOCUMENTS

| | | |
|---|---|---|
| JP | 08-279297 | 10/1996 |
| JP | 09-082922 | 3/1997 |

OTHER PUBLICATIONS

Tae-Sung Jung et al.; "A 117-mm2 3.3-V 128 Mb Multilevel NAND Flash Memory for Mass Storage Applications," IEEE Journal of Solid-State Circuits, vol. 31, No. 11, Nov. 1996, pp. 1575-1583.

Young, Joon Choi et al.; "A High Speed Programming Scheme for Multi-Level NAND Flash Memory," Samsung Electronics Co., Ltd., Kiheung, Korea, 1996 Symposium on VLSI Circuits Digest of Technical Papers, pp. 170-171.

* cited by examiner

SEMICONDUCTOR MEMORY DEVICE

This application is a continuation of U.S. application Ser. No. 12/632,203, filed Dec. 7, 2009, which is a continuation of U.S. application Ser. No. 12/040,457, filed Feb. 29, 2008, now U.S. Pat. No. 7,649,780, which is a continuation of U.S. application Ser. No. 11/313,826, filed Dec. 22, 2005, now U.S. Pat. No. 7,349,259, which is a continuation of U.S. application Ser. No. 11/055,655, filed Feb. 11, 2005, now U.S. Pat. No. 7,061,807, which is a continuation of U.S. application Ser. No. 10/622,744, filed Jul. 21, 2003, now U.S. Pat. No. 6,868,013, which is a continuation of U.S. application Ser. No. 10/315,030, filed Dec. 10, 2002, now U.S. Pat. No. 6,621,738, which is a continuation of U.S. application Ser. No. 10/024,189, filed Dec. 21, 2001, now U.S. Pat. No. 6,525,964, which is a continuation of U.S. application Ser. No. 09/768,588, filed Jan. 25, 2001, now U.S. Pat. No. 6,344,996, which is a divisional of U.S. application Ser. No. 09/504,903, filed Feb. 16, 2000, which is now U.S. Pat. No. 6,208,573, and which is a divisional of U.S. application Ser. No. 09/055,216, filed Apr. 6, 1998, which is now U.S. Pat. No. 6,064,611, the specifications for which are hereby incorporated by reference.

BACKGROUND OF THE INVENTION

Field of the Invention

The present invention relates to a semiconductor memory device, more particularly, to a semiconductor memory device used for multi-level flash memories, multi-level EEPROMs and multi-level EPROMs.

The MOSFET structure made in such a manner that a floating gate (charge storage layer) and a control gate are provided on a semiconductor substrate, is well known as one of the memory cells in a flash memory.

Ordinarily, in one memory cell of a flash memory, one-bit data, that is, data "0" or "1" is stored. Further, whether the data in a memory cell is "0" or "1" can be identified through the amount of charges stored in the floating gate.

On the other hand, in order to secure a large data capacity, recently the development of a multi-level memory system according to which multi-bit data are stored in one memory cell is being pushed forward. For instance, in the case of the four-level memory system, "0", "1", "2 or "3" is stored in one memory.

In a multi-level flash memory, "which data is stored in a memory cell" is judged depending on the amount of charges stored in the floating gate.

The stored state of data, that is, the relationship between the data and the amount of charges in the floating gate will now be described by taking a four-level flash memory for example.

The data "0" corresponds to an erased state.

The erased state is a state in which positive charges are stored in the floating gate. That is, in the erased state, the floating gate is charged positively with reference to the neutral state in which the amount of charges in the floating gate is zero.

The erased state is obtained in such a manner that, for instance, a high voltage (about 20V) is applied to the semiconductor substrate, the control gate is set to the ground voltage (0V), and the positive charges are moved from the semiconductor substrate to the floating gate.

The data "1", "2" and "3" correspond to programmed states.

The programmed state is a state in which negative charges are stored in the floating gate. However, the amount of negative charges in the floating gate which is in the data "2" state is set so as to be larger than the amount of negative charges in the floating gate in the data "1" state; the amount of charges in the floating gate in the data "3" state is set so as to be larger than the amount of negative charges in the floating gate in the data "2" state.

In the programmed state, the floating gate is charged negatively with reference to the neutral state in which the amount of charges in the floating gate is zero.

The programmed state is obtained in such a manner that, for instance, the semiconductor substrate, the source and the drain are set to the ground voltage, respectively, a high voltage (about 16V) is applied to the control gate, and the negative charges are moved from the semiconductor substrate to the floating gate.

During a programming operation, in a cell in which the data "0" is desired to be maintained, the source, the drain and the channel are set to 5V, respectively. In this case, even if the high voltage (about 16V) is applied to the control gate, and the substrate is set to the ground voltage (0V), the data "0" is maintained since the positive charges are held in the floating gate.

In this way, by one memory cell, four kinds of programmed states ("0", "1", "2" and "3") can be realized.

As for flash memories, those flash memories which have NAND memory cell units are known.

Each of these memory cell units has a memory cell column consisting of a plurality of (for example, four) memory cells, a first select transistor connected between one end of the memory cell column and a bitline, and a second select transistor connected between the other end of the memory cell column and a source line.

In this connection, it is noted that the source line is used in common for all the memory cell units.

In the case of a flash memory with NAND memory cell units, at the time of programming of data "0", the bitline is set to the power supply voltage (for example, 3V), the gate of the first select transistor is set to the power supply voltage VCC, the control gate of the selected memory cell is set to a first high voltage (for example, 16V), and the voltage at the control gates of the unselected memory cells is set to a second high voltage (for example, 10V), whereby the charges stored in the floating gate of the selected memory cell is retained.

In this case, the channels of the respective memory cells in the NAND memory cell unit are connected to the bitline via the first select transistor, so that the voltage at each memory cell assumes, to take into consideration the so-called threshold voltage drop of the first select transistor, a predetermined voltage below the power supply voltage VCC (for example, 3V) at the beginning.

After this, when the first select transistor becomes non-conductive, the channel voltage of the respective memory cells in the NAND memory cell unit rises through the electrostatic capacitance produced between the control gates and the channels. For instance, if the coupling ratio of the electrostatic capacitance is 50%, then the channel voltage becomes about 5V.

However, when negative charges are accumulated in the floating gates of the respective memory cells, the threshold voltage of the memory cells becomes high. As a result, the channel voltage of the respective memory cells in which the data "0" is being programmed fall in inverse proportion as the threshold voltage of the memory cells increases, and the reliability in respect of the retention of the date "0" falls.

For example, in case the threshold voltage of the memory cells is −1V, when the voltage of the control gates is about 0V, the channel voltage becomes about 1V, and, when the voltage of the control gates is about 10V, the channel voltage becomes about 6V (Coupling ratio: 50%).

Further, in case the threshold voltage of the memory cells is 3V, when the voltage of the control gates is about 1V, the voltage of the channels becomes about 0V, and when the voltage of the control gate is about 10V, the channel voltage becomes about 4.5V (Coupling ration: 50%).

In the case of a flash memory with NAND memory cell units, the data in the respective memory cell can be read out in such a manner that a predetermined read voltage is applied to the control gate, so that, in accordance with the data of the memory cell, the particular memory cell is brought into ON or OFF state, and the current flowing through the channel of the memory cell at this time is detected.

Here, by preparing three kinds of read voltages, four kinds of programmed states (the kinds and amounts of the charges in the floating gate, that is, the states in which the threshold voltages differ from one another) can be identified.

Further, the NAND memory cell units are each constituted in such a manner that a plurality of memory cells are connected in series and, thus, characterized in that the cell current when a read operation is performed is small in amount (for example, about 1 µm).

As for the read time, it is pointed out that, if the bitline capacitance coupled to the selected memory cell is about 5 pF for instance, then a time of about 5 µs is required for the bitline voltage to be varied by 1V by the cell current.

In order to read out the data of the memory cells at high speed by the use of a small amount of current, for instance an N-channel MOS transistor is connected between the respective bitline and the read circuit, so that a voltage of about 2V is applied to the gate of said MOS transistor to precharge the bitline.

In this case, if it is assumed that the threshold voltage of the N-channel MOS transistor is about 1V, then the bitline is precharged to about 1V by taking into consideration the so-called threshold voltage drop of said MOS transistor.

When the bitline is precharged, the N-channel MOS transistor becomes gradually higher in resistance until it becomes non-conductive. However, the precharge of the bitline is not continued until the N-channel MOS transistor becomes completely non-conductive if the substantial precharge time is taken into consideration.

During a read operation, a cell current flows to the selected memory cell, and, when the voltage at the bitline falls, the channel resistance of the N-channel MOS transistor connected to the bitline is lowered in resistance, so that it becomes possible to sense the voltage variation (the data of the memory cell) of the bitline at high speed by detecting this state.

The variation in the channel resistance of the N-channel MOS transistor can be detected by comparing the resistance value of the channel resistance of said MOS transistor with the resistance value of a so-called reference resistor. Due to this, current paths are provided to the reference resistor, the N-channel MOS transistor and the memory cells.

However, in case, by such a read operation, the data of a plurality of selected memory cells are read out at the same time, it happens that, in response to the threshold voltages of the respective selected memory cells, a large current flows through the source line serving in common for all the cell units, or conversely, no current at all flows to said source line.

For instance, in case cell currents flow to almost all the selected memory cells, that is, in case the data in almost all the selected memory cells are "0", a large current flows to the source line, so that the voltage in the source line varies. The voltage variation in the source line increases the state in which the data in the selected memory cells cannot be accurately read out.

As described above, if the threshold voltages of the memory cells in a memory cell unit is high, then the channel voltages of the memory cells do not rise sufficiently, and therefore, there is the fear that, in the selected memory cell, not the data "0" but the data "1" may be programmed.

Further, at the time of reading, it takes much time to detect the state of a memory cell to which a small amount of cell current flows, but, if the state of the memory cell is to be detected at high speed, an accurate detection of the cell state cannot be carried out.

BRIEF SUMMARY OF THE INVENTION

It is the object of the present invention to sufficiently secure the channel voltage of memory cells at the time of programming and to detect the state of memory cells at high speed and with accuracy at the time of reading.

The semiconductor memory device according to a first aspect of the present invention comprises: memory cells; a bitline connected to the memory cells; a read circuit including a precharge circuit; and a first transistor connected between the bitline and the read circuit, wherein a first voltage is applied to a gate of the first transistor when the precharge circuit precharges the bitline, and a second voltage which is different from the first voltage is applied to the gate of the first transistor when the read circuit senses a change in a voltage of the bitline.

Preferred embodiments of the first aspect of the present invention are as follows:
(1) The precharge circuit includes a second transistor connected between the first transistor and a power supply terminal, and the second transistor is set into a non-conductive state when the second voltage is applied to the gate of the first transistor.
(2) The first transistor is n-channel MOS transistors.
(3) The second transistor is n-channel MOS transistors.
(4) An electrostatic capacitance of the bitline is larger than an electrostatic capacitance of a connecting portion between the first transistor and the read circuit.

The semiconductor memory device according to the first aspect of the present invention is constituted in such a manner that, between each bitline and a read circuit, a MOS transistor is connected, so that, when the bitline is precharged, a first voltage is applied to the gate of the MOS transistor, while, at the time of reading, a second voltage which is lower than the first voltage is applied to the gate of the MOS transistor.

Accordingly, after the bitline is precharged, the MOS transistor can be made non-conductive in a short time, so that the voltage variation in the bitline can be sensed without using a reference resistor or the like, and the programmed state of the memory cell can be detected at high speed and with accuracy.

The semiconductor memory device according to a second aspect of the present invention comprises: a NAND memory cell unit having a plurality of memory cells connected in series, a first end in which a first select transistor is arranged, and a second end in which a second select transistor is arranged; and a programming circuit for programming into a selected memory cell among the plurality of memory cells, wherein the programming circuit applies, at the time of programming, a first voltage to a gate electrode of the selected memory cell, applies a second voltage which is lower than the first voltage to a gate electrode of a memory cell positioned adjacent at the second end side, to the selected memory cell, and applies a third voltage which is lower than the first voltage but higher than the second voltage to gate electrodes of remaining memory cells.

Preferred embodiments of the second aspect of the present invention are as follows:

(1) The first select transistor is connected to a bitline, while the second select transistor is connected to a source line.
(2) Programming is performed successively from a memory cell adjacent to the second select transistor toward a memory cell adjacent to the first select transistor into the plurality of memory cells constituting the NAND memory cell unit in (1).
(3) The first voltage is a high voltage for programming, while the second voltage is the ground voltage.
(4) Before performing the programming, the programming circuit applies a fourth voltage to a gate electrode of at least one of memory cell, among the remaining memory cells, which are positioned closer to the first select transistor with reference to the selected memory cell, while, a fifth voltage is applied to at least one gate electrode of memory cells, among the remaining memory cells, which are positioned closer to the second select transistor with reference to the selected memory cell, whereby the channels of the plurality of memory cells are charged in (1).
(5) The fifth voltage is higher than the fourth voltage in (4).
(6) Before performing the programming, the programming circuit applies the fourth voltage to a gate electrode of the selected memory cell and applies the second voltage to a gate electrode of a memory cell which is adjacent to the second end side of the selected memory in (5).
(7) Before performing the programming, the programming circuit applies the fifth voltage to a gate electrode of the selected memory cell and applies the second voltage to a gate electrode of a memory cell which is adjacent to the second end side of the selected memory cell in (5).
(8) The fourth and fifth voltages are lower than the third voltage in (6) or (7).
(9) The fourth voltage is a power supply voltage in (8).
(10) At a time of programming, the programming circuit applies the third voltage to a gate electrode of a memory cell, among the remaining memory cells, which exists at a side closer to the second select transistor with reference to the selected memory cell and, thereafter, applies the third voltage to a gate electrode of a memory cell, among the remaining memory cells, which exists at a side closer to the first select transistor with reference to the selected memory cell in (1).
(11) At a time of programming, the programming circuit applies the third voltage to a gate electrode of a memory cell, among the remaining memory cells, which exists at a side closer to the second select transistor with reference to the selected memory cell and, thereafter, applies the first voltage to a gate electrode of the selected memory cell in (10).
(12) A timing at which the first voltage is applied to the gate electrode of the selected memory cell is substantially equal to a timing at which the third voltage is applied to a gate electrode of a memory cell, among the remaining memory cells, which exists at a side closer to the first select transistor with reference to the selected memory cell in (11).

The semiconductor memory device according to the second aspect of the present invention is constituted in such a manner that, when "0" data is programmed, a sufficient and stable channel voltage can be produced without depending on the threshold voltage of the programmed memory cell. Thus, a semiconductor memory device which can produce with sufficient stability the channel voltage of the memory cells when the "0" data is programmed can be realized.

As described above, in the case of the semiconductor memory device according to the present invention, after a bitline is charged by the MOS transistor, the gate voltage of the MOS transistor is changed, whereby, after the bitline is charged, the MOS transistor can be made non-conductive in a short time. Thus, it follows that a semiconductor memory device, which can detect the programmed state of the memory cells at high speed and with accuracy, can be realized.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out hereinbefore.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

Figure 1:
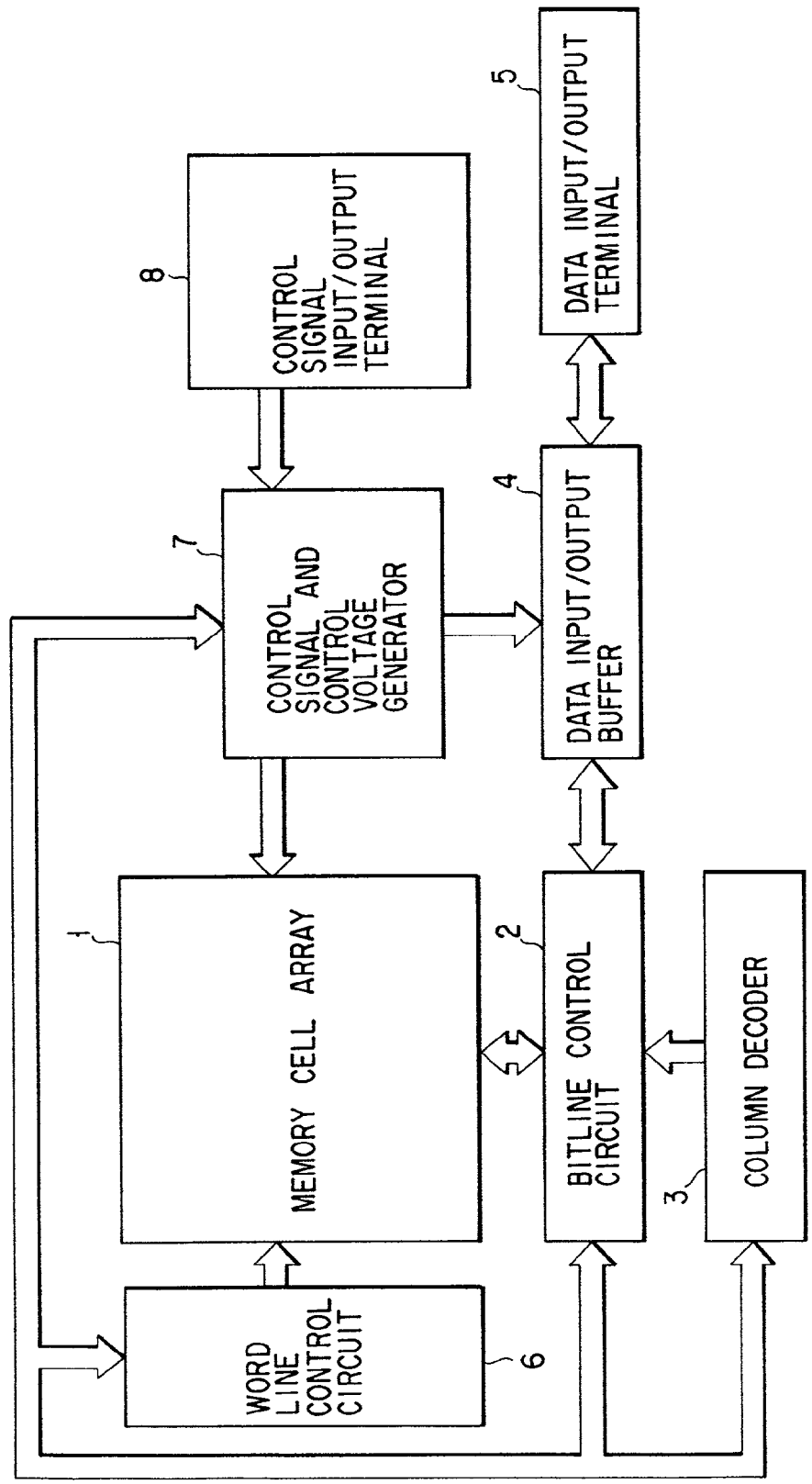
FIG. 1 is a block diagram showing the semiconductor memory device according to an embodiment of the present invention.

The semiconductor memory device according to the present invention will now be described in detail, referring to the drawings.

FIG. 1 shows the constitutional arrangement of the multi-level NAND flash memory according to an embodiment of the present invention.

A memory cell array 1 includes a plurality of NAND memory cell units, a plurality of bitlines, a plurality of word lines, and a source line. Each of the NAND memory cell units has a memory cell column comprising a plurality of memory cells connected in series and of select transistors connected to both ends of said memory cell column, respectively. The source line serves in common for all the memory cell units.

A bitline control circuit 2 reads out the data of the memory cells through the bitlines in the memory cell array 1, detects the state of the respective memory cells through the bitlines, and applies a programming voltage to the memory cells through the bitlines to effect programming into the memory cells.

The bitline control circuit 2 includes a plurality of data memory circuits. The data memory circuits are provided for the columns of the memory cell array 1. The data of a memory cell read out by the data memory circuit selected by a column decoder 3 is read out externally from a data input/output terminal 5 via a data input/output buffer 4.

Further, the programming data which has been inputted to the data input/output terminal 5 from the outside is latched, via the data input/output buffer 4, as an initial control data in the data memory circuit selected by the column decoder 3. The control data of the respective data memory circuit controls the programming control voltage applied to the selected memory cell in the memory cell array 1 via the bitline.

A word line control circuit 6 selects one of a plurality of word lines in the memory cell array 1 and applies to the selected word line a predetermined voltage necessary for a read operation, a programming operation or an erase operation.

The operation of the memory cell array 1, the operation of the bitline control circuit 2, the operation of the column decoder 3, the operation of the data input/output buffer 4, and the operation of the word line control circuit 6 are respectively controlled by a control signal and control voltage generator 7.

Further, the control signal and control voltage generator 7 operates on the basis of a control signal applied to a control signal input terminal 8 from the outside.

Figure 2:
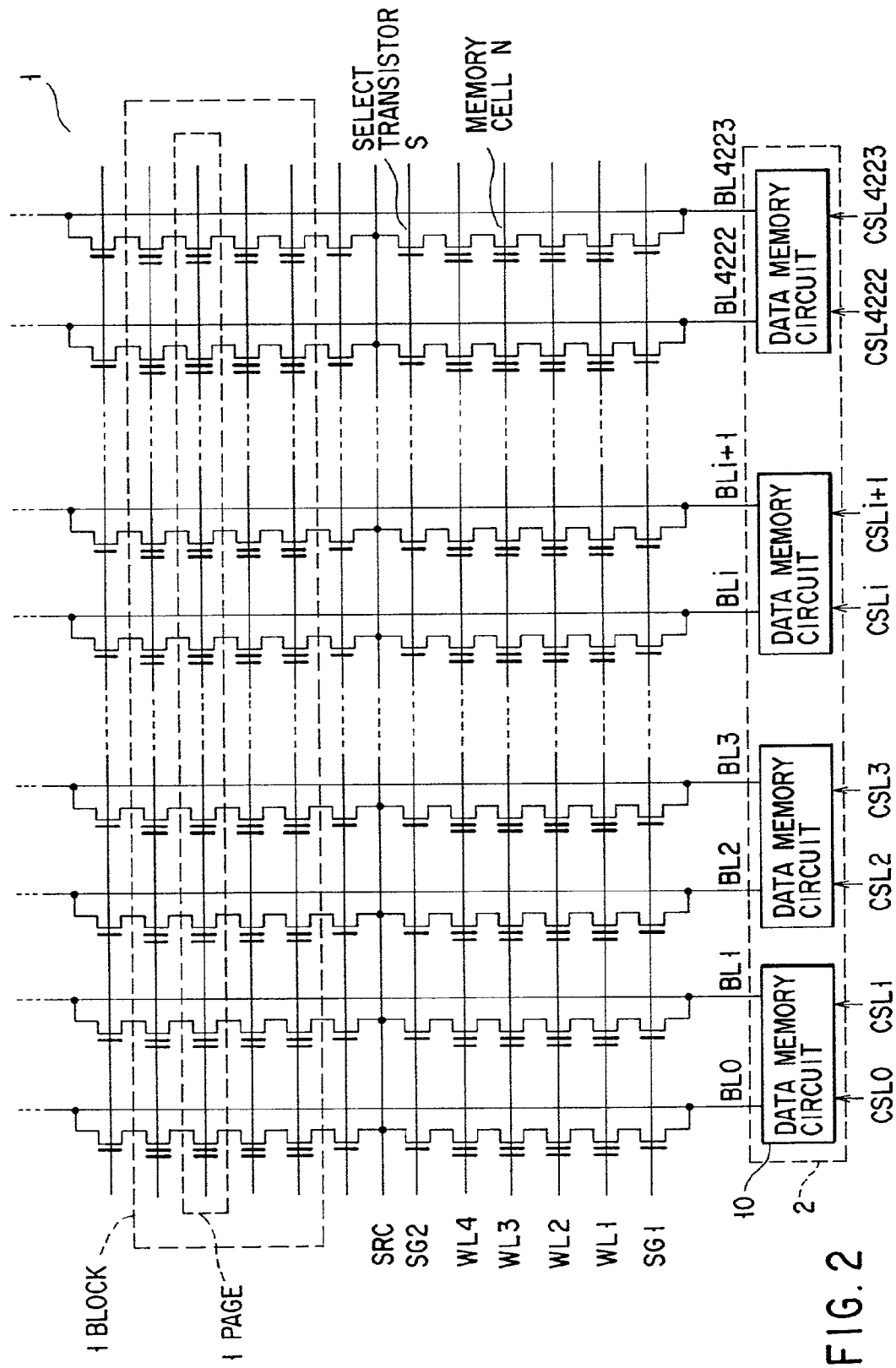
FIG. 2 is a circuit diagram showing the constitutional arrangement of the memory cell array and the data memory circuits shown in FIG. 1.

FIG. 2 shows an example of the constitutional arrangement of the memory cell array 1 and the bitline control circuit 2 shown in FIG. 1.

Each of the NAND memory cell units has a memory cell column comprising four memory cells M connected in series, a select transistors S connected between one end of the memory cell column and a bitline BL, and a select transistor S connected between the other end of the memory cell column and a source line SRC.

The gates of the memory cells M are connected to word lines WLm (wherein m stands for a number which is 1, 2, 3 or 4), respectively, and the select transistors S each positioned at the bitline side are connected to a select gate SG1, respectively, while the select transistors S positioned at the source line side are connected to a select gate SG2.

The plurality of memory cells M which share one word line WLm constitute a unit so-called page, and, in the case of this embodiment, one block has four pages. Further, in this embodiment, only two blocks are shown, but the memory cell array 1 actually comprises an optional number of blocks (for example, 1024 blocks). Further, in this embodiment, the number of bitlines BL0, BL1, . . . BL4223 is 4224, but can be any other optional number (for example, 2112).

The bitline control circuit 2 comprises a plurality of data memory circuits 10. In this embodiment, each of the data memory circuits 10 is provided for two bitlines BLi and BLi+1 (wherein i stands for 0 or an even number), but can be provided, instead, for one, four, six or nine bitlines.

Column select signals CSL0, CSL1, . . . , CSL4223 are the output signals from the column decoder 3. The Column select signals CSLi and CSLi+1 are inputted to the data memory circuit 10 connected to the bitlines BLi and BLi+1.

At the time of reading, the data of the memory cell which is latched in the data memory circuit 10 selected by the Column select signals CSLi and CSLi+1 is lead to the data input/output buffer 4 as read-out data.

Prior to programming, the control data for controlling the programming control voltage applied to a memory cell at the time of programming is initially transferred to one of the bitlines BLi and BLi+1 on the basis of the Column select signals CSLi and CSLi+1.

In the case of detecting a programmed state, the programmed state of a memory cell connected to one of the bitlines BLi and BLi+1 is detected.

Figure 3A:
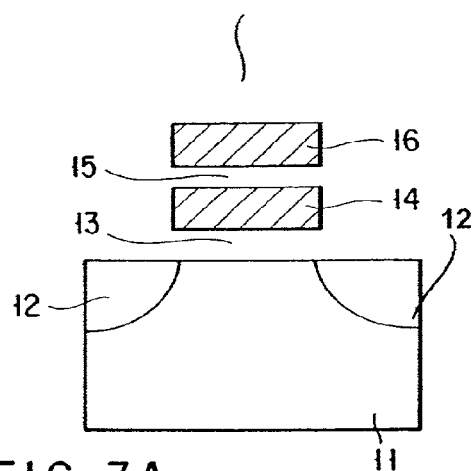
FIG. 3A and FIG. 3B are, respectively, schematic diagrams showing the structure of a memory cell and the structure of a select transistor shown in FIG. 2.
Figure 3B:
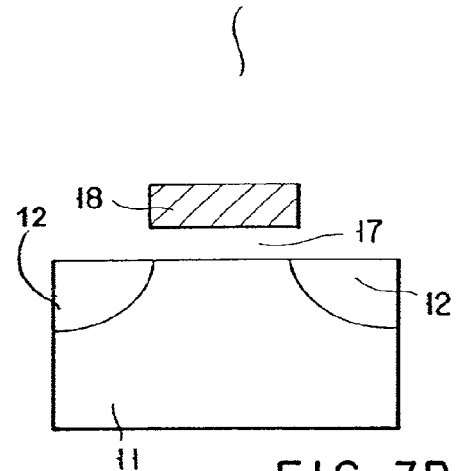

FIG. 3A and FIG. 3B show the structure of a memory cell M and the structure of a select transistor S shown in FIG. 2.

In the surface of a p-type substrate 11, an n-type diffusion layer 12, in which a source or a drain is formed, is formed.

The memory cell M comprises the n-type diffusion layer 12 in the semiconductor substrate 11, a gate insulation film 13 on the substrate 11, a floating gate 14 on the gate insulation film 13, an insulation film 15 on the floating gate 14, and a control gate (word line) 16 on the insulation film 15. The select transistor S comprises an n-type diffusion layer 12 in a semiconductor substrate 11, a gate insulation film 17 on the semiconductor substrate 11, and a select gate 18 on the gate insulation film 17.

When a voltage higher than the threshold voltage of the memory cell M is applied to the control gate 16 of the memory cell M, a channel is formed in that surface portion of the semiconductor substrate 11 which lies immediately beneath the floating gate 14.

For instance, in case it is assumed that the capacitance between the control gate 16 and the floating gate 14 is 1 pF, the capacitance between the floating gate 14 and the channel is 1 pF, the capacitance between the channel and the semiconductor substrate 11 is 0.25 pF, and the capacitance between the n-type diffusion layer 12 and the semiconductor substrate 11 is 0.25 pF, then the capacitive coupling ratio of the control gate 16 and the channel and the capacitive coupling ratio of the control gate 16 and the n-type diffusion layer 12 are 50%, respectively.

In this case, if the channel and the n-type diffusion layer 12 are in floating state, it follows that, if the voltage at the control gate 16 rises by 1V, then the voltage of the channel and the n-type diffusion layer 12 rises by 0.5V.

Figure 4:
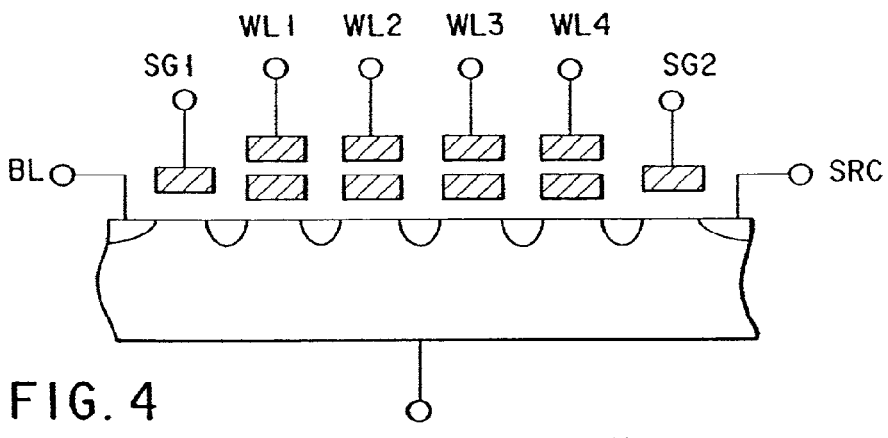
FIG. 4 is a schematic diagram showing the structure of a memory cell unit.

FIG. 4 shows the structure of a NAND memory cell unit shown in FIG. 2.

A memory cell column has four memory cells M, and one end of the memory cell column is connected to the source line SRC via one select transistor S, while the other end of the memory cell column is connected to the bitline BL via the other select transistor S.

In an erase operation, the voltage Vsub of the semiconductor substrate is set to about 20V, and the voltages of the select gates SG1, SG2, the source line SRC and the bitline BL are set to about 20V, and the voltages of the work lines WL1 to WL4 in the selected block to be block-erased (which means "erasing the data in all the memory cells within the Block at the same time") are set to 0V.

With this time, the negative charges (electrons) move from the floating gate to the channel, so that the floating gate is charged positively with reference to the neutral state (the state in which no charge exists), and therefore, the threshold voltage of the all the memory cells M within the selected block become negative (the state in which data is "0").

In an unselected block which is not block-erased, the voltage of the word lines WL1 to WL4 is set to about 20V, whereby the data of the respective memory cells are held in the state which existed before the erase operation is executed.

In the case of a programming operation, the following voltage settings are affected all together. That is, the voltage of one selected word line in the selected block is set to about 16V; the voltage of the three unselected word lines in the selected block is set to a voltage lower than the programming voltage; the voltage of the select gate SG1 is set to the power supply voltage VCC, the voltage of the select gate SG2 is set to 0V; and the voltages of the whole word lines in the unselected block and all the select gates are set to 0V.

For instance, to make explanation with reference to the case of the four-level memory system, when the data "1", "2" and "3" are programmed, the voltage of the bitline BL is set to 0V. In this case, in the selected memory cell, electrons are injected into the floating gate, and the threshold voltage becomes positive.

When the date "0" is programmed, the bitline BL is set to the power supply voltage VCC. Since, in this case, the voltage at the select gate SG1 is the power supply voltage VCC, the select gate S at the bitline side becomes non-conductive, and the channel and the n-type diffusion layer of the memory cell are brought into a floating state.

The channel voltage is raised through the capacitive coupling between the channel and the control gate. When the voltage—lower than the programming voltage—applied to the respective control gates is about 10V, then the channel voltage becomes about 5V if the coupling ratio of the capacitive coupling is 50%. However, the higher the threshold voltage of the memory cells becomes, the lower the channel voltage of the memory cells at the time of programming the data "0" becomes.

This is because, if the threshold voltage of the memory cells is about 1V, then the channel is not formed until the voltage at the control gates becomes about 1V.

In other words, in case the threshold voltage of the memory cells is 1V, the channel voltage is about 0V when the voltage of the control gates is about 1V, so that, when the voltage of the control gates is about 10V, the channel voltages becomes about 4.5V (Coupling ratio: 50%).

In contrast, in case the threshold voltage of the memory cells is about −1V, the channel voltages can be charged to about 1V even if the voltage at the control gates is about 0V. That is, if the voltage of the control gates becomes about 10V, then the channel voltage becomes about 6V.

In the present invention, when the data "0" is programmed, the voltage of an unselected word line (for example, WL3) which is adjacent, at the source line side, to a selected word line (for example, WL2) in a selected block is set, particularly, to about 0V, and, to the remaining unselected word lines (for example, WL1 and WL4) in the selected block, a voltage of about 10V is applied.

Further, as for the order in accordance with which the data "0" is programmed to the memory cells in a memory cell unit, the memory cell to which said data "0" is programmed first is the memory cell coupled to the word line WL4 which is positioned closest to the source line, the programming of the data "0" is successively shifted to the memory cells coupled to the word lines which are positioned closer to the bitline, and finally, the data "0" is programmed into the memory cell coupled to the word line WL1 which is positioned closest to the bitline.

That is, in the memory cell unit, the data in the memory cells existing at the side closer to the bitline as compared with the memory cell connected to the selected word line are all erased; that is, the data "0" is programmed into said memory cells. In other words, the threshold voltage of the memory cells positioned at the side closer to the bitline with reference to the memory cell connected to the selected word line is in negative state.

On the other hand, the voltage at the control gates of the memory cells adjacent, at the source line side, to the selected memory cell coupled to the selected word line is 0V, so that, when the voltage at the sources and drains of said adjacent memory cells is enhanced through the capacitive coupling between the control gates of the memory cells and the channels, said memory cells become non-conductive.

Thus, the channel voltage of the selected memory cell rises together with the erased memory cell which exists at the side closer to the bitline as compared with the selected memory cell. Due to this, the channel voltage of the selected memory cell is always secured at, e.g. about 6V or more. That is, no electron is injected into the floating gate, and thus, the programming of data "0" can be effected.

For instance, in case the selected word line is the word line WL4, the voltages of the unselected word lines WL1 to WL3 are set to about 10V. In case the selected word line is WL3, the voltages of the unselected word lines WL1 and WL2 are set to about 10V, and the voltage of the unselected word line WL4 is set to 0V.

However, in case the selected word line is WL3, the memory cell connected to the unselected word line WL4 cannot be made non-conductive in some cases due to the fact that no memory cell exists at the side closer to the source line than said memory cell connected to the unselected word line WL4. However, in this case, nothing is the matter since the memory cells positioned closer to the bitline are larger in number than the memory cell coupled to the unselected word line WL4.

Further, in case the selected word line is WL3, the voltage of the unselected word line WL4 may be set to about 10V. In case the selected word line is WL1, the voltages of the unselected word lines WL3 and WL4 are about 10V, and the voltage of the unselected word line WL2 is about 0V.

Here, it should be noted that the unselected word lines existing closer to the bitline with reference to the selected word line function as data transfer gates and thus must not be set to 0V. For instance, when the word line WL2 is selected, the voltage of the word line WL1 must not be set to 0V. If the voltage of the word line WL1 is set to 0V, the memory cell coupled to the word line WL1 become non-conductive.

Further, the voltages of the bitline when the data "1", "2" and "3" are programmed may not be 0V. For instance, when the data "1" is programmed, the voltage of the bitline may be set to 1.2V, and the voltage of the bitline when the data "2" and "3" are programmed may be set to 0V.

This is because the amount of electrons injected into the floating gate of the memory cell M in order to store the data "1" can be smaller than the amount of electrons injected into the floating gate of the memory cell M in order to store the date "2" and "3".

The voltages of the bitline when the data "1", "2" and "3" are programmed may differ from one another. For instance, the voltage of the bitline when the data "1" is programmed may be set to about 2.4V; the voltage of the bitline when the data "2" is programmed may be set to about 1.2V; and the voltage of the bitline when the data "3" is programmed may be set to 0V.

In a case of the four-level memory system, the threshold voltage of the memory cell corresponding to the data "0" is set to 0 or less; the threshold voltage of the memory ell corresponding to the data "1" is set to 0.4 to 0.8V; the threshold voltage of the memory cell corresponding to the data "2" is set to 1.6 to 2.0V; and the threshold voltage of the memory cell corresponding to the data "3" is set to 2.8 to 3.2V.

At the time of reading, the voltage of the selected word line WL2 in the selected block is set to Vread. The voltages of the unselected word lines WL1, WL3 and WL4 in the selected block are set to, for instance, about 4V. The voltages of the select gates SG1 and SG2 in the selected block are also set to, for instance, about 4V. The voltages of the all the word lines in the unselected blocks and all the select gates SG are 0V. The source line SRC is connected to the ground point through the parasitic resistance.

Further, if the voltage of the source line does not rise due to the parasitic resistance, the data stored in the memory cell is read out by the use of three kinds of read voltages referred to as below:

(1) When the voltage Vread of the selected word line is 0V, if the selected memory cell stores the data "1", "2" or "3", the bitline is precharged to 1V and remains 1V even after it is brought into a floating state. If the selected memory cell stores the data "0", the bitline is precharged to 1V and falls to 0.5V after it is brought into a floating state.

(2) When the voltage Vread of the selected word line is 1.2V, if the selected memory cell stores the data "2" or "3", the bitline is precharged to 1V and the bitline remains at 1V even after it is brought into a floating state. If the selected memory cell stores the data "0" or "1", the bitline is precharged to 1V and falls to 0.5V after it is brought into a floating state.

(3) When the voltage Vread of the selected word line is 2.4V, if the selected memory cell stores the data "3", the bitline is precharged to 1V and said bitline remains at 1V even after it is brought into a floating state. If the selected memory cell stores the data "0", "1" or "2", the bitline is precharged to 1V and falls to 0.5V after it is brought into a floating state.

Figure 5:
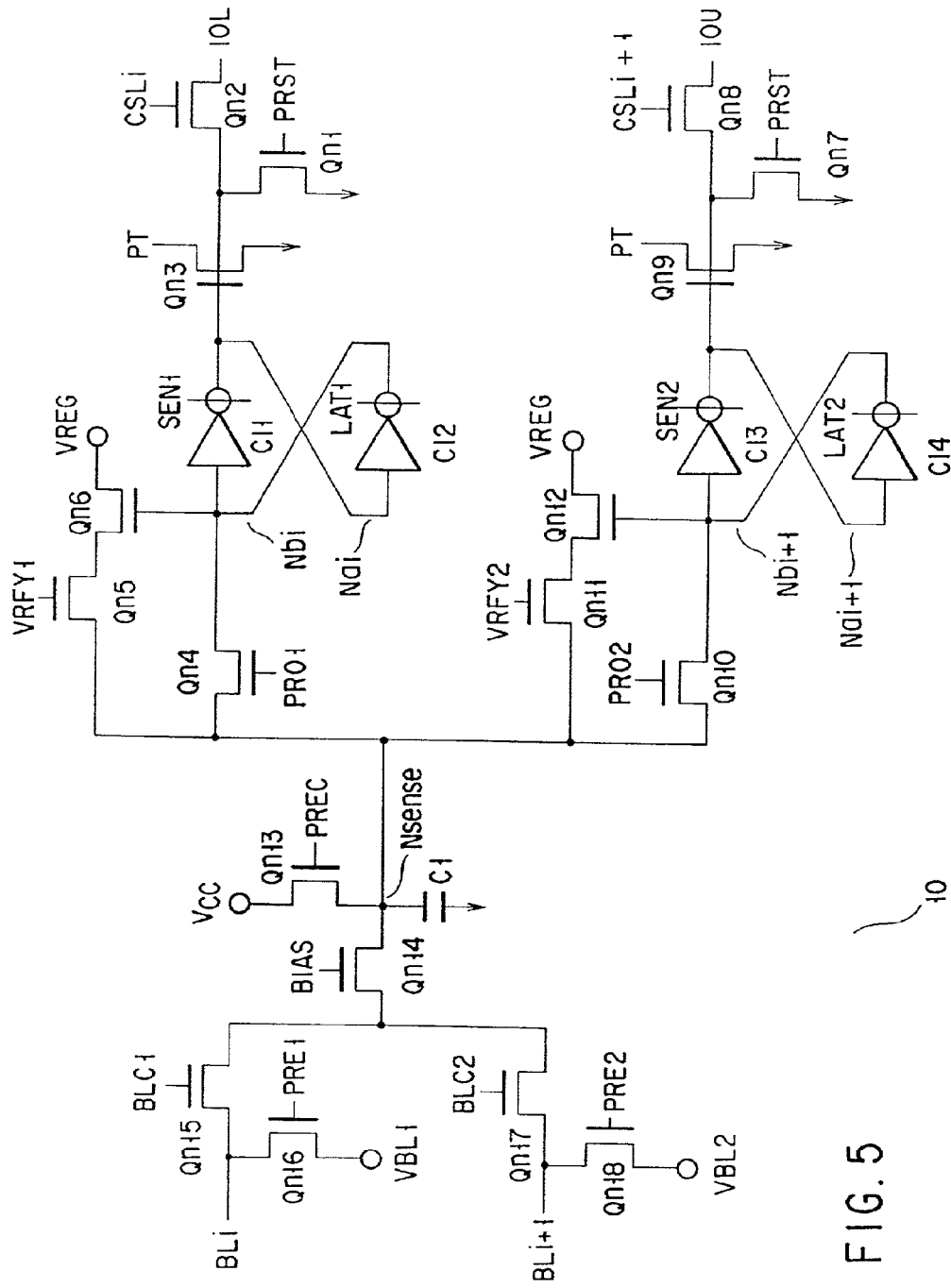
FIG. 5 is a circuit diagram showing the concrete constitutional arrangement of the data memory circuit according to an embodiment of the present invention.

FIG. 5 shows a more concrete constitutional arrangement of the memory cell array 1 and the data memory circuit 10 shown in FIG. 2. Here, the constitutional arrangement thereof in a four-level flash memory is shown by way of example.

Clock synchronous inverters CI1 and CI2 and n-channel MOS transistors Qn4, Qn5 and Qn6 constitute a first sub-data circuit. Further, clock synchronous inverters CI3 and CI4 and n-channel MOS transistors Qn10, Qn11 and Qn12 constitute a second sub-data circuit.

The first and second sub-data circuits store first and second sub-data at the time of programming, respectively. The first and second sub-data circuits store first and second read sub-data at the time of reading, respectively.

The state in which a node Nai in the first sub-data circuit is in "H" level is the state in which the first sub-data circuit stores the first read sub-data of "1" or the first sub-data of "1".

Further, the state in which a node Nai+1 in the second sub-data circuit is in "H" level is the state in which the second sub-data circuit stores the second read sub-data of "1" or the second sub-data of "1".

The state in which the node Nai in the first sub-data circuit is in "L" level is the state in which the first sub-data circuit stores the first read sub-data of "0" or the first sub-data of "0".

The state in which the node Nai+1 in the second sub-data circuit is in "L" level is the state in which the second sub-data circuit stores the second read sub-data of "0" or the second sub-data of "0".

N-channel MOS transistors Qn1 and Qn7 are each for a signal PRST to become "H" so as to set the sub-data of "0" in the first and second sub-data circuits, respectively.

N-channel MOS transistors Qn2 and Qn8 are for electrically connecting the first and second sub-data circuits to data input/out lines IOL and IOU, respectively. To the gate electrodes of the respective n-channel MOS transistors Qn2 and Qn8, the output CSLi and the output CSLi+1 from the column decoder 3 are applied.

For instance, when CSLi becomes "H" level, the first sub-data circuit of the data memory circuit 10 provided to the bitlines BLi and BLi+1 is electrically connected to the data input/output line IOL. The data input/output lines IOL and IOU are connected to the data input/output buffer 4 and thus can set the sub-data in the first or second sub-data circuit or can output the sub-data read out from the first or second sub-data circuit to the data input/output buffer 4.

N-channel MOS transistors Qn3 and Qn9 detect whether the sub-data in the sub-data circuit and the second sub-data circuits are all "0" or not, respectively. The data memory circuits 10 are 2112 in number in this embodiment, so that, if the 2112 first sub-data and the 2112 second sub-data are all "0", a common signal line PT and the ground line are electrically non-conductive from each other; and thus, this state is detected.

A capacitor C1 is provided for amplifying the variation of the bitline voltage together with n-channel MOS transistors Qn13 and Qn14. As will be described in detail later, a signal PREC is set to the power supply voltage VCC (for example, 3V), and a signal BIAS is set to 2V, whereby the bitline is charged.

If the threshold voltage of the n-channel MOS transistors is 1V, the bitline is charged to as far as a voltage close to 1V. If the bitline is charged until the n-channel MOS transistor Qn14 becomes non-conductive, it takes a lot of time, so that, the signals PREC and BIAS are set to 0V after the lapse of a predetermined time.

When the bitline voltage is detected, the signal BIAS is set to 1.8V for instance. This voltage of 1.8V is set so that, if there is no variation in the bitline voltage, the n-channel MOS transistor Qn14 may become non-conductive. If the bitline voltage varies to become 0.8V, then the n-channel MOS transistor Qn14 becomes conductive.

Upon conduction of the n-channel MOS transistor Qn14, the voltage at a node Nsense falls. For instance, if the capacitance of the bitline is 5 pF, the capacitance of the capacitor C1 is set to a smaller value of, e.g. 0.5 pF, whereby the variation in the bitline voltage gives a large influence on the variation in the node Nsense. Thus, the bitline voltage can be amplified with good sensitivity.

For instance, if the voltage of the bitline changes from 1V to 0.7V, then the voltage at the node Nsense changes from 2V to about 0.73V. Even if the voltage of the bitline changes from 1V to 0.9V, the voltage at the node Nsense remain at 2V. Thus, it follows that, in response to the change of 0.2V in the voltage of the bitline, the voltage at the node Nsense changes by 1.27V.

N-channel MOS transistors Qn15 and Qn17 control the electric connection of the first and second sub-data circuits to the bitline BLi or BLi+1. If a signal BLC1 is in "H" level and a signal BLC2 is in "L" level, then the first and second sub-data circuits are electrically connected to the bitline BLi.

If the signal BLC1 is in "L" level, and the signal BLC2 is in "H" level, then the first and second sub-data circuit are electrically connected to the bitline BLi+1. N-channel MOS transistors Qn16 and Qn18 control the electrical connection between the bitline BLi and a voltage VBL1 and the electrical connection between the bitline BLi+1 and a voltage VBL2.

If the signal PRE1 is in "H" level, then the bitline BLi is electrically connected to the voltage VBL1, and if the signal PRE2 is in "H" level, then the bitline BLi+1 is electrically connected to the voltage VBL2.

Through the bitline BLi or BLi+1, a signal representing the data or the programmed state of the memory cell M is transferred. In the first sub-data circuit, the clock synchronous inverter CI1 and the clock synchronous inverter CI3 in the second sub-data circuit function also as sense amplifiers for sensing the logic levels of the signals on the bitlines BL.

In this embodiment, the clock synchronous inverters sense the absolute values of the voltages on the bitlines BL as logic levels, but differential-type sense amplifiers or the like can alternatively be used, in which case the difference between the bitline voltage and a reference voltage is detected.

Figures 6A, 6B:
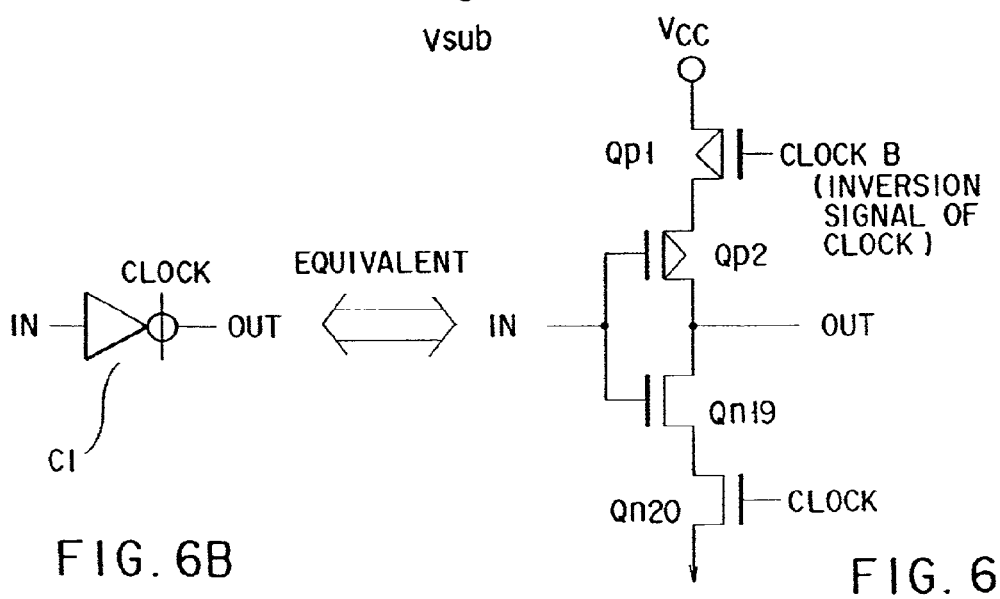
FIG. 6A and FIG. 6B are circuit diagrams showing the concrete constitutional arrangement of a clock synchronous inverter.

FIG. 6A and FIG. 6B show the concrete constitution of the clock synchronous inverter CI.

The inverter circuit is constituted of an n-channel MOS transistor Qn19 and a p-channel MOS transistor Qp2, and the input terminal of the inverter circuit is designated as IN, while the output terminal thereof is designated as OUT. In order to activate or deactivate this inverter circuit by the use of a signal CLOCK and an inversion signal (CLOCKS) of CLOCK, n-channel MOS transistor Qn20 and a p-channel MOS transistor Qp1 are provided. The inverter circuit is activated when the signal CLOCK is in "H" level, and said inverter circuit is deactivated when the signal CLOCK is in "L" level, and the signal CLOCKB is in "H" level.

Signals SEN1, LAT1, SEN2, LAT2, PRO1, PRO2, BLC1, BLC2, PRE1, PRE2, VRFY1, VRFY2 and PRST and voltages VBL1, VBL2, VREG, BIAS, PREC and PT are control signals and the output signals from the control voltage generator 7; they are common to all the data memory circuits 10 shown in FIG. 2. The voltage VCC is the power supply voltage of, e.g. 3V.

The first and second sub-data circuits store the sub-data of "0" or "1" and each adapted to change the sub-data of "1" to the sub-data of "0" in response to the "H" level of the bitline signal and hold the sub-data of "0".

The present invention can also be embodied, without using the concrete arrangement of the above-described embodiment, by the use of various circuits which have the functions mentioned above. In the case of the sub-data circuits according to this embodiment, before the signals PRO1 or PRO2 become "H" level and the voltage level of the bitline BL is sensed by the clock synchronous inverter CI1 or CI3, the voltage level of the bitline BL is adjusted by the n-channel MOS transistors Qn5 and Qn6 or Qn11 and Qn12 in accordance with the first or second sub-data.

Only in case the first or second sub-data is "0", the voltage level of the bitline BL is made "H". When the signal PRO1 or PRO2 becomes "H" level, and, at this time, the "H" level of the bitline is transferred to the input terminal of the clock synchronous inverter CI1 or CI3, the voltage at the node Nai or Nai+1 is made "L" level.

Further, by the clock synchronous inverter CI2 or CI4, the sub-data of "0" is stored; and thus, the sub-data of "0" which is originally stored is not changed. In case the sub-data originally stored is "1", the sub-data of "1" is changed to the sub-data of "0" when the level of the bitline BL is "H", while, when the level of the bitline BNL is "L", the sub-data of "1" is retained.

Figure 7:
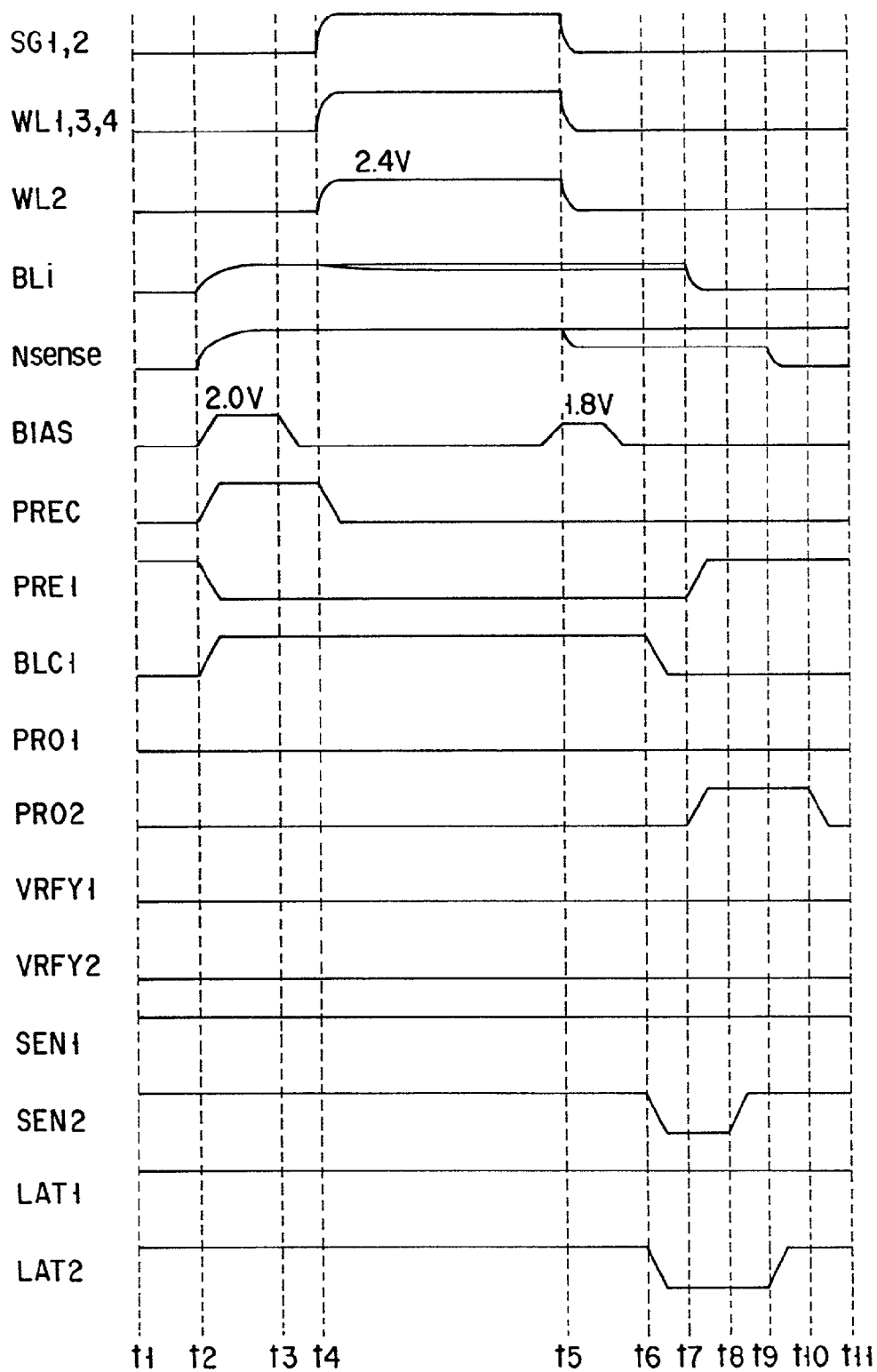
FIG. 7 is a schematic diagram showing the read operation of the semiconductor memory device according to an embodiment of the present invention.
Figure 8:
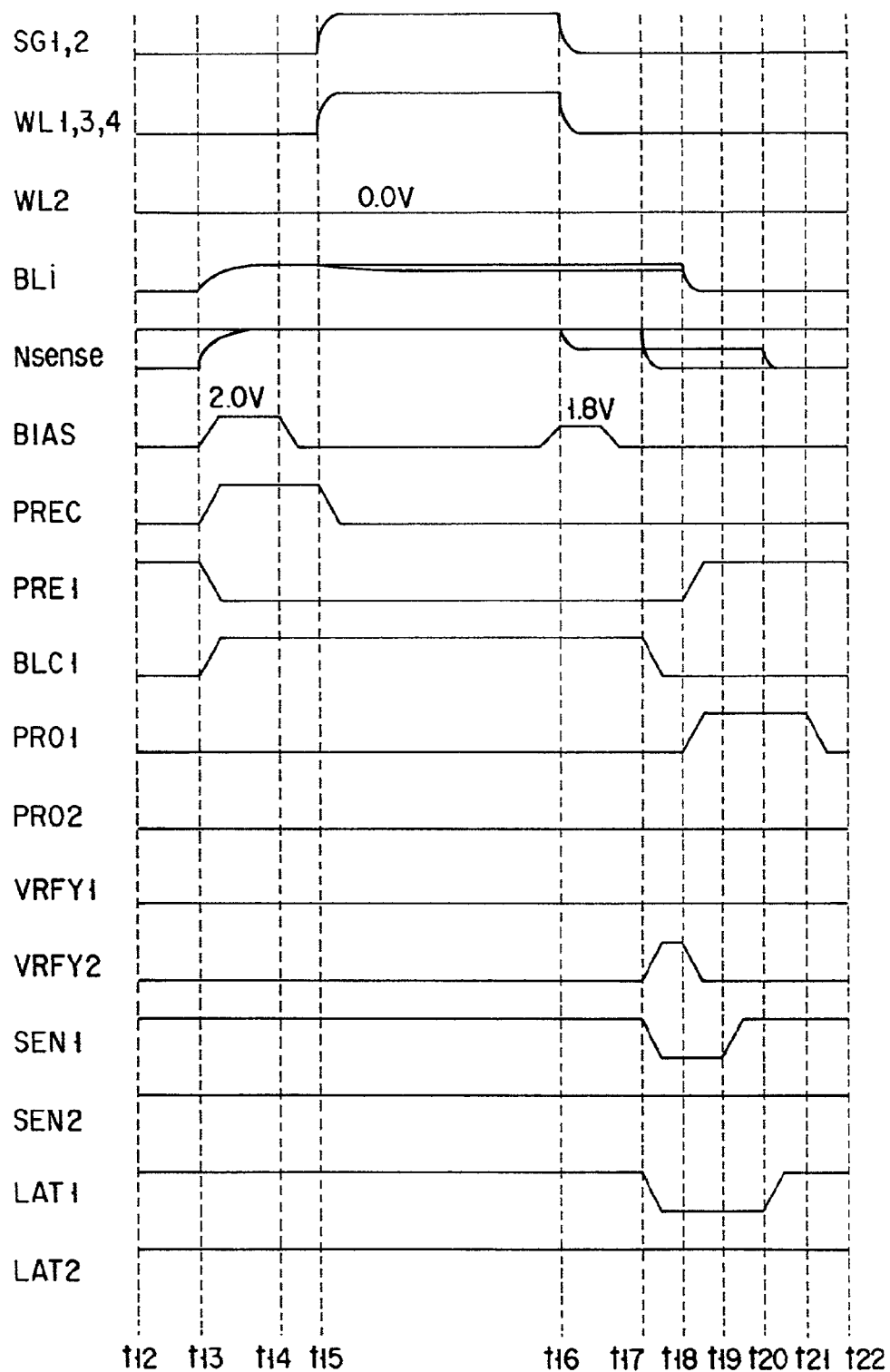
FIG. 8 is a schematic diagram showing the read operation of the semiconductor memory device according to the embodiment of the present invention.
Figure 9:
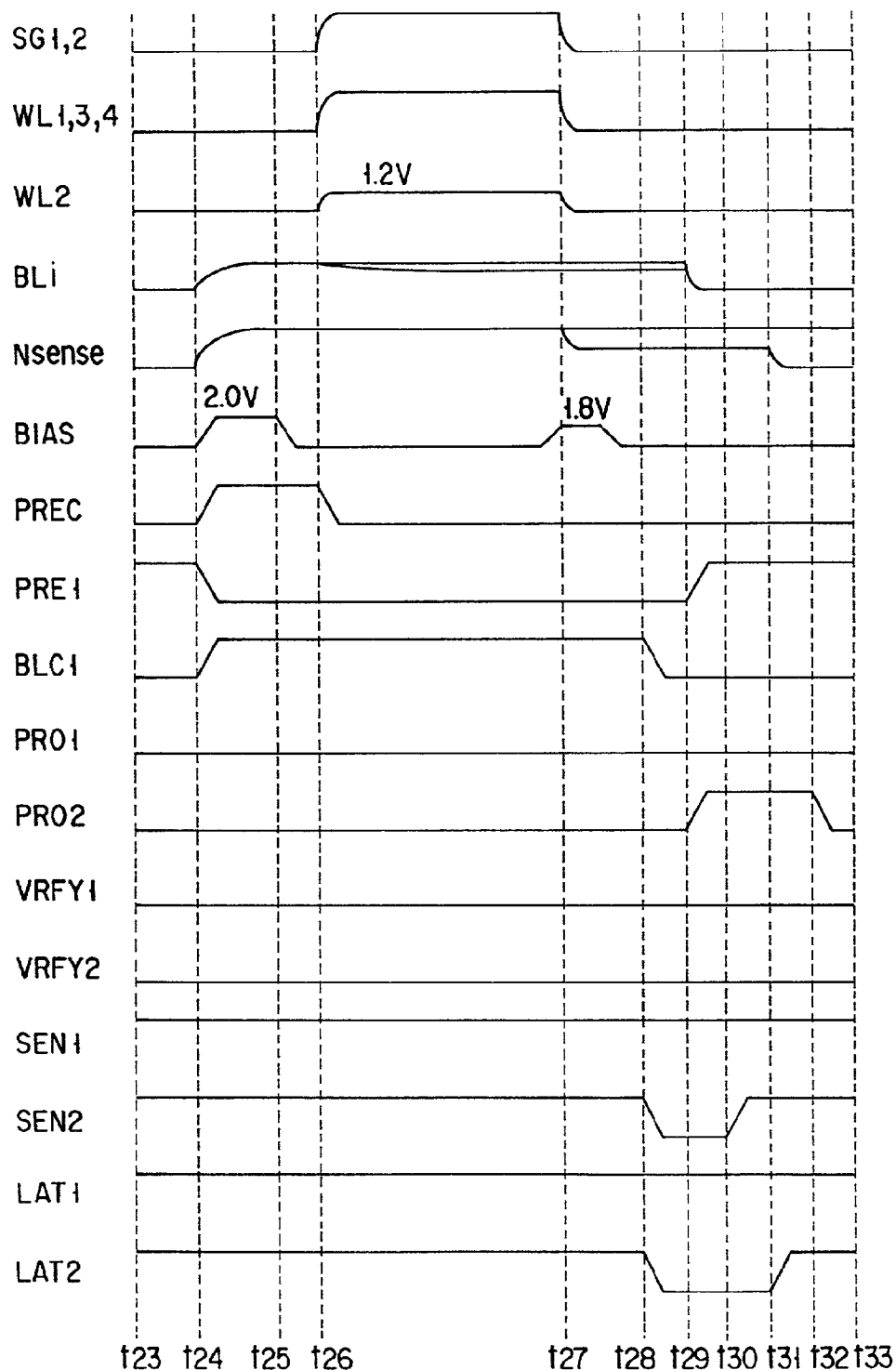
FIG. 9 is a schematic diagram showing the read operation of the semiconductor memory device according to the embodiment of the present invention.

FIG. 7, FIG. 8 and FIG. 9 show the operation of reading the four-level data stored in the memory cells.

Here, the bitlines BL0, BL2, . . . , Bli, . . . , BL4222 are selected (BLi being shown as the representative for them), and in this case the word line WL2 is selected, and the four-level memory system is employed by way of example.

If the memory levels are limited to three levels, three-level memory can be easily executed. Further, here, the voltage VBL1 and VBL2 remain at 0V, BLC2 remains in "L" level, PRE2 remains in "H" level, PRST remains in "L" level, the bitline BLi+1 remains at 0V, the signals CSLi and CSLi+1 remain at 0V, and the voltage VREG remains at 0V, so that they are not shown in FIG. 7, FIG. 8 and FIG. 9.

First, the signal PRE1 becomes "L" level, and the signal BLC1 becomes "H" level, whereby the bitline BLi is selected. The signal PREC becomes VCC, and the signal BIAS becomes 2V, whereby the bitline BLi is charged to 1V (t2). The threshold voltages of the n-channel MOS transistors Qn are assumed to be 1V unless otherwise specified.

The signal BIAS becomes 0V, with which the charging of the bitline BLi is completed (t3). Subsequently, the signal PREC becomes 0V, so that the charging of the node Nsense is completed (t4). The select gates SG1 and SG2 and the unselected word lines WL1, WL3 and WL4 in the selected block are set to 4V, and the selected word line WL2 is set to 2.4V (t4).

Table 1 shows the relationship between the data stored in the memory cell M and the threshold voltage thereof.

TABLE 1

| DATA OF MEMORY CELL | THRESHOLD VOLTAGE OF MEMORY CELL |
| --- | --- |
| 0 | 0 V or less |
| 1 | 0.4 V to 0.8 V |
| 2 | 1.6 V to 2.0 V |
| 3 | 2.8 V to 3.2 V |

When the voltage of the selected word line WL2 becomes 2.4V, the bitline BLi remains at 1V only in case the memory cell stores the "3" data. In other cases, the voltage of the bitline BLi becomes 0.7 or less. After the lapse of a predetermined period of time (t4 to t5), the signal BIAS is set to 1.8V. Only in cases when the memory cell stores the "3" data, the voltage at the node Nsense remains at 2V.

In other cases, the voltage at the node Nsense becomes 0.8V or less. After the signal BIAS becomes 0V again, and the bitline BLi is disconnected from the node Nsense, the signal SEN2 and LAT2 become "L" level, whereby the clock synchronous inverters CI3 and CI4 are deactivated (t6).

When the signal PRO2 becomes "H" level (t7), and the signal SEN2 becomes "H" level (t8), the clock synchronous inverter CI3 is activated, so that the voltage at the node Nsense is sensed. When the signal LAT2 becomes "H" level (t9), the clock synchronous inverter CI4 is activated, and the logic level of the sensed signal is latched.

The select gates SG1 and SG2 and the word lines WL1 to WL4 are reset to 0V at time t5. The signal BLC1 becomes "L" level at time t6, and the signal PRE1 becomes "H" level at time t7, so that the bitline BLi is reset to 0V at time t7.

The signal PRO2 becomes "L" level (t10), with which the operation for detecting whether the threshold voltage of the memory cell M is 2.4V or more is completed. Only in case the memory cell stores the "3" data, the second read sub-data in the second sub-data circuit becomes "0". In other cases, the second read sub-data is "1".

Subsequently, the operation of detecting whether or not the threshold voltage of the memory cell M is larger than 0.0V is started. First, the signal PRE1 becomes "L" level and the signal BLC1 becomes "H" level, so that the bitline BLi is selected.

The signal PREC becomes VCC, and the signal BIAS becomes 2V, so that the bitline BLi is charged to 1V (t13). The signal BIAS becomes 0V, whereby the charging of the bitline BLi is completed (t14).

Subsequently, the signal PREC becomes 0V, so that the charging of the node Nsense is completed (t15). The voltages at the select gates SG1 and SG2 and the unselected word lines WL1, WL3 and WL4 in the selected block are set to 4V, and the voltages of the selected word line WL2 is made to remain at 0.0V (t15).

If the voltage of the selected word line WL2 is 0.0V, the bitline BLi remains at 1V in case the memory cell stores the "1", "2" or "3" data. In case the memory cell stores "0" data, the voltage of the bitline BLi becomes 0.7V or less.

After the lapse of a predetermined period of time (t15 to t16), the signal BIAS is set to 1.8V. In case the memory cell stores "1", "2" or "3" data, the node Nsense remains at 2V. In case the memory cell stores the "0" data, the voltage at the node Nsense becomes 0.8V or less.

After the signal BIAS becomes 0V again and, thus, the bitline BLi is disconnected from the node Nsense, the signal SEN2 and the LAT2 become "L" level, whereby the clock synchronous inverter CI4 is deactivated (t28).

At the same time, the signal VRFY2 becomes VCC, so that, only in case the second read sub-data in the second sub-data circuit is "0", the voltage at the node Nsense is set to 0V (t17). When the signal PRO1 becomes "H" level (t18) and the signal SEN1 becomes "H" level (t19), the clock synchronous inverter CI1 is activated, so that the voltage at the node Nsense is sensed. When the signal LAT1 becomes "H" level (t20), the clock synchronous inverter CI2 is activated, whereby the logic level of the sensed signal is latched.

The select gates SG1 and SG2, the word lines WL1 to WL4 are reset to 0V at time t16. The signal BLC1 becomes "L" level at time t17, the signal PRE1 becomes "H" level at time t18, so that the bitline BLi is reset to 0V at time t18.

The signal PRO1 becomes "L" level (t21), with which the operation of detecting whether or not the threshold voltage of the memory cell M is larger than 0.0V is completed. Only in case the memory cell stores the "0" or "3" data, the first read sub-data in the first sub-data circuit becomes "1". In other cases, the first read sub-data is "0".

Subsequently, the operation of detecting whether or not the threshold voltage of the memory cell M is higher than 1.2V is started. First, the signal PRE1 becomes "L" level, and the signal BLC1 becomes "H" level, whereby the bitline BLi is selected.

The signal PREC becomes VCC and the signal BIAS becomes 2V, so that the bitline BLi is charged to 1V (t24). The signal BIAS becomes 0V, and thus, the charging of the bitline BLi is completed (t25).

Subsequently, the signal PREC becomes 0V, and thus, the charging of the node Nsense is completed (t26). The select gates SG1 and SG2 and the unselected word lines WL1, WL3 and WL4 in the selected block are set to 4V, and the selected word lines WL2 is set to 1.2V (t26).

When the selected word line WL2 becomes 1.2V, the bitline BLi remains at 1V in case the memory cell stores the "2" or "3" data. In case the memory cell stores "0" or "1" data, the bit voltage of the line BLi becomes 0.7V or less.

After the lapse of a predetermined period of time (t26 to t27), the signal BIAS is set to 1.8V. In case the memory cell stores the "2" or "3" data, the node Nsense remains at 2V. In case the memory cell stores the "0" or "1" data, the voltage at the node Nsense becomes 0.8V or less.

After the signal BIAS becomes 0V again and, thus, the bitline BLi is disconnected from the node Nsense, the signal SEN2 and the LAT 2 become "L" level, whereby the clock synchronous inverter CI4 is deactivated (t28).

When the signal PRO2 becomes "H" level (t29), and the signal SEN2 becomes "H" level (t30), the clock synchronous inverter CI3 is activated, so that the voltage at the node Nsense is sensed. When the signal LAT2 becomes "H" level (t31), the clock synchronous inverter CI4 is activated, so that the logic level of the sensed signal is latched.

The voltages at the select gates SG1 and SG2 and the word lines WL1 to WL4 are reset to 0V at time t27. The signal BLC1 becomes "L" level at time t28, and the signal PRE1 becomes "H" level at time t29, whereby the bitline BLi is reset to 0V at time t29.

The signal PRO2 becomes "L" level (t32), whereby the operation of detecting whether or not the voltage of the memory cell M is higher than 1.2V is completed. Only in case the memory cell stores the "0" or "1" data, the second read sub-data in the second sub-data circuit becomes "1". In other cases, the second read sub-data is "0".

With this, the operation of storing, in the order shown in FIG. 7, FIG. 8 and FIG. 9, the data of the memory cell M into the data memory circuit 10 as the read data is completed.

After this, when the signals CSLi, CSLi+1 become "H" level, the first read sub-data is outputted to the data input/output line IOL, and the second read sub-data is outputted to the data input/output line IOU and then delivered to the outside from the data input/output terminal 5 through the data output buffer 4.

Table 2 shows the relationship between the four-level data of the memory cell and the first and second read dubdata.

TABLE 2

| DATA OF MEMORY CELL | FIRST READ SUB-DATA | SECOND READ SUB-DATA |
| --- | --- | --- |
| 0 | 1 | 1 |
| 1 | 0 | 1 |
| 2 | 0 | 0 |
| 3 | 1 | 0 |

Figure 10:
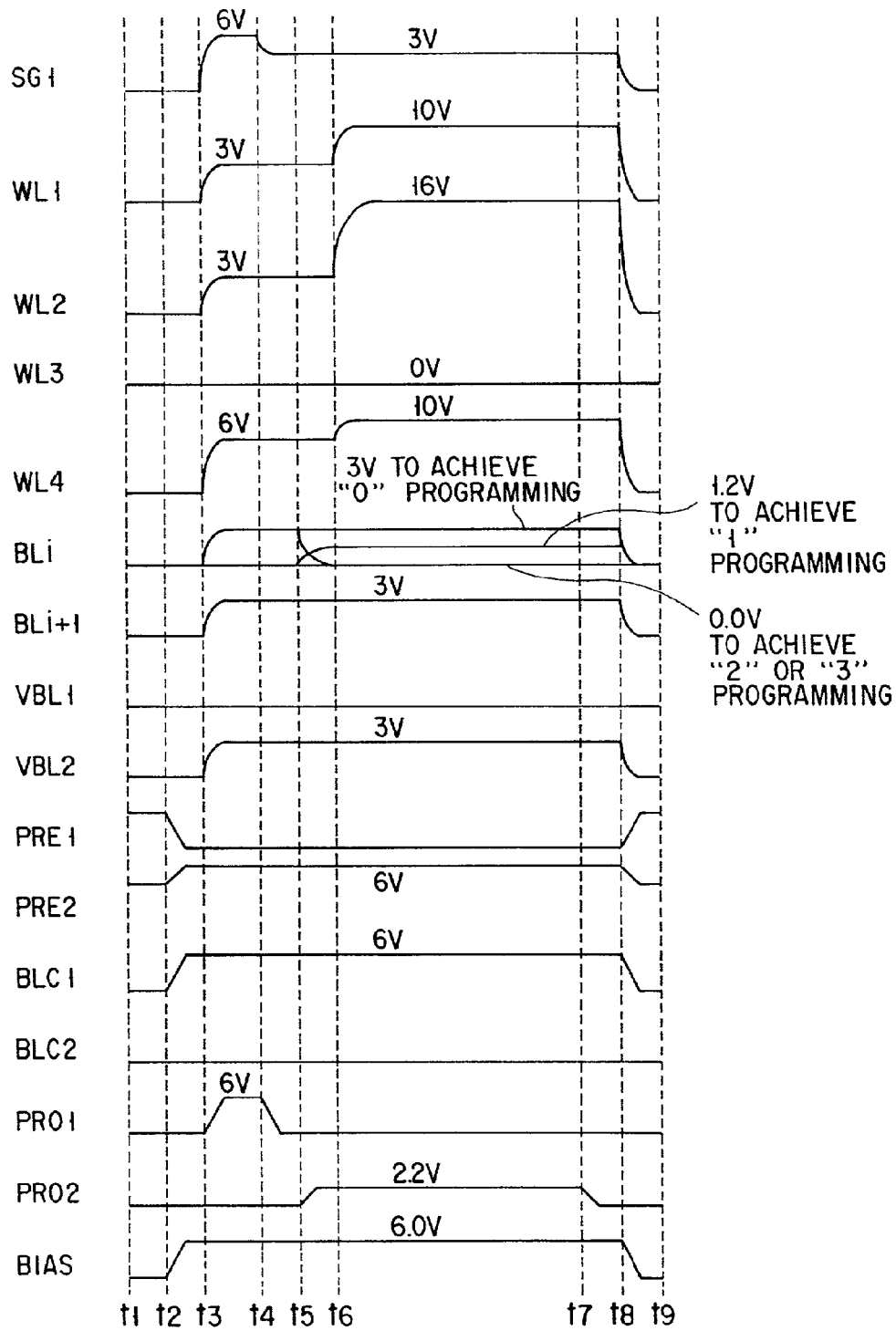
FIG. 10 is a schematic diagram showing a first programming operation of the semiconductor memory device according to the embodiment of the present invention.

FIG. 10 shows the programming operation. Here, there is shown the case where the bitlines BL0, BL2, . . . , Bli, . . . , BL4222 are selected (BLi being shown as the representative for them), and the word line_WL2 is selected. Here, the four-level memory is employed by way of example. By limiting the memory levels to three levels, the three-level memory can be easily effected.

Prior to the programming, the initial setting of the control data to the data memory circuit 10 is performed. The initial setting of the control data to the data memory circuit 10 provided for the bitline BLi is carried out as follows:

The initial sub-data of the first sub-data circuit is transferred to the data input/output line IOL, while the initial sub-data of the second sub-data circuit is transferred to the data input/output line IOU, and the signals CSLi and the CSLi+1 are made "H" level, so that the initial sub-data are stored in the first and second sub-data circuits.

The selection of the signals CSL is changed, and the initial control data is set in an optional number of data memory circuits 10. In this case, the relationship between the initial control data and the initial sub-data is as shown in Table 3.

TABLE 3

| INITIAL CONTROL DATA | INITIAL SUB-DATA IN THE FIRST SUB-DATA CIRCUIT | INITIAL SUB-DATA IN THE SECOND SUB-DATA CIRCUIT |
|---|---|---|
| 0 | 0 | 0 |
| 1 | 1 | 0 |
| 2 | 1 | 1 |
| 3 | 0 | 1 |

Here, prior to all the initial control data setting, the signal PRST should desirably be made "H" level to preset the control data in all the data memory circuits 10 to "0". As will be described later, the state of the memory cell M is not changed by the control data "0", so that it suffices if the initial control data is set in only desired data memory circuits—of the 2112 data memory circuits 10 in all—from outside.

It is a matter of course that the initial control data may be set in all the 2112 data memory circuits 10 from outside. The signal SEN1 remains in "H" level, the signal LAT1 remains in "H" level, the signal VRFY1 remains in "L" level, the signal SEN2 remains in "H" level, the signal LAT2 remains in "H" level, the signal VRFY2 remains in "L" level, the voltage VREG remains at 0V, and the voltage PREC remains at 0V, so that they are not shown in FIG. 10.

In the case of programming operation, first the signal PRE1 becomes "L" level, whereby the bitline BLi is disconnected from the voltage VBL1 (t2). At the same time, the signal BLC1 becomes 6V, so that the bitline BLi is selected (t2).

Further, the signals BIAS and PRE2 also become 6V (t2). The voltage VBL2 becomes VCC (3V in this case), so that the unselected bitline BLi+1 is charged to VCC through the n-channel MOS transistor Qn18 (t3 to t4).

The signal PRO1 becomes 3V, and the selected bitline BLi is charged in accordance with the first sub-data (t3 to t4). In this case, the bitline BLi is charged to VCC in case the control data is "0" or "3", but the voltage on the bitline Bli is changed to 0V in case the control data is "1" or "2".

The voltages at the select gate SG1 and the word line WL4 are changed to 6V (t3 to t4), and the select gate SG1 is changed to VCC after it transfers the voltage VCC of the bitline (t4). The word line WL3 remains at 0V. The word lines WL1 and WL2 are changed to VCC. The select gate SG2 remains at 0V.

After this, the signal PRO2 becomes 2.2V, and the voltage of the selected bitline BLi is changed in accordance with the second sub-data (t5). In case the second sub-data is "0", the bitline BLi which has previously been at 0V is charged to 1.2V which is lower by the threshold voltage (1V) of the n-channel MOS transistor Qn10 than 2.2V.

In case the second sub-data is "0", the bitline BLi which has previously been set to VCC remains at VCC since the n-channel MOS transistor Qn10 is non-conductive. In case the second sub-data is "1", the n-channel MOS transistor Qn10 is conductive, so that the voltage of the bitline BLi is 0V.

As a result, the bitline BLi becomes VCC in case the control data is "0", the voltage of said bitline BLi becomes 1.2V in case the control data is "1"; the voltage of said bitline BLi becomes 0V in case the control data is "2"; and the voltage of said bitline Bli becomes 0V in case the control data is "3".

The selected word line WL2 is set to 16V, and the WL1 and WL4 of the unselected word lines are set to 10V, whereby the electron injection into the floating gate of the memory cell starts in accordance with the control data (t6 to t7).

In case the bitline BL is at 0V, the injection of electrons is caused when the voltage difference between the channel of the memory and the word line is 16V. In case the bitline BL is 1.2V, the injection of electrons is started when the voltage difference between the channel of the memory cell and the word line is 14.8V, but the amount of electrons injected is smaller than in case the voltage difference between the channel of the memory cell and the word line is 16V.

In case the voltage of the bitline BL is the VCC, the voltage of the word line WL1 becomes 10V, and the voltage of the word line WL2 becomes 16V, whereby the channel voltage of the selected memory cell rises to a value (for example, 6V) higher than the VCC, and the voltage between the channel of the memory cell and the word line is small, so that no electron injection is caused.

After the signal PRO2 is reset to 0V (t7), the word lines WL1 to WL4 are reset to 0V, the signal PRE1 is reset to "H" level, the signal PRE2 is reset to "H" level, the signal BLC1 is reset to "L" level, and the signal BIAS is reset to "L" level (t8), with which the programming operation is completed.

Figure 11:
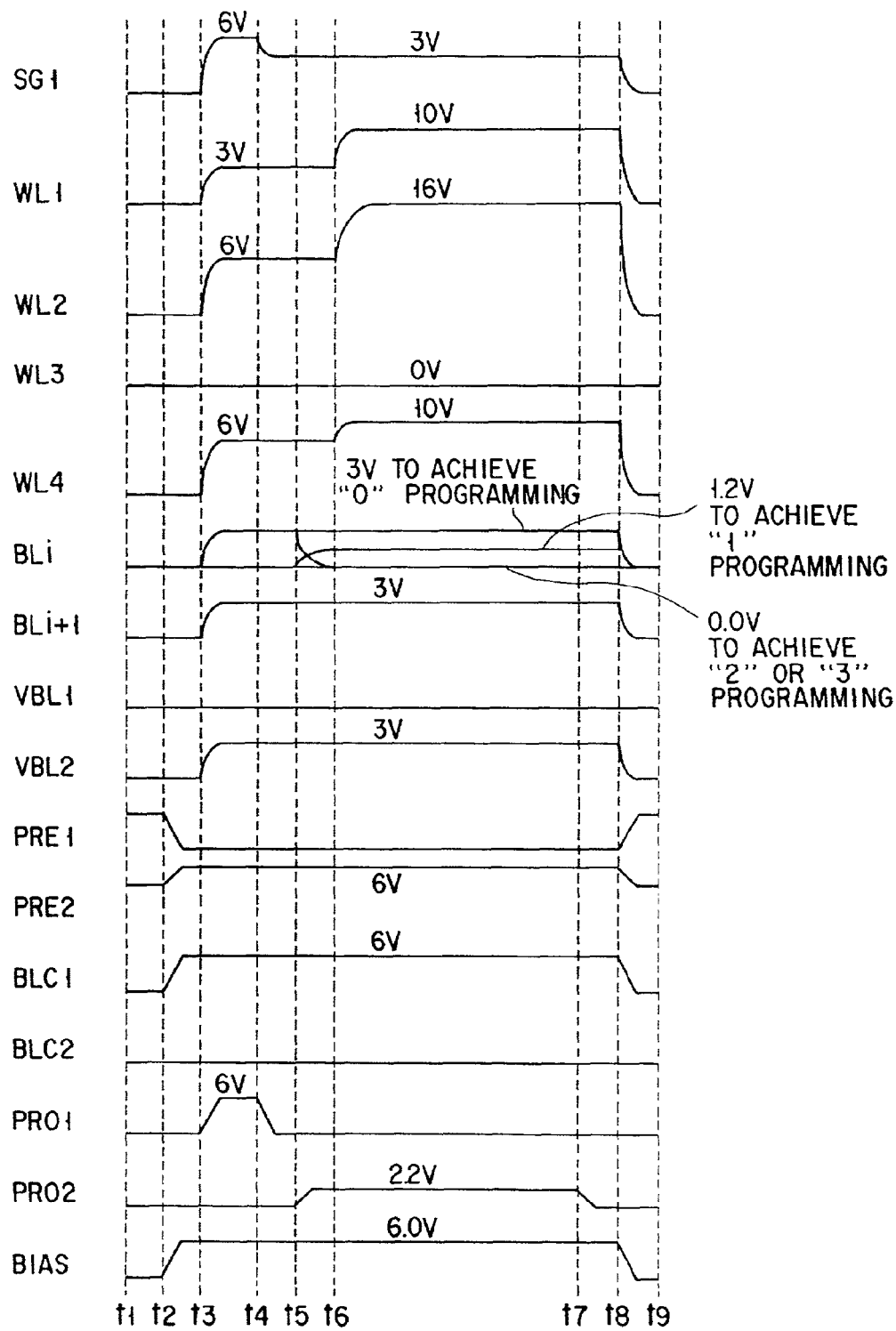
FIG. 11 is a schematic diagram showing a second programming operation of the semiconductor memory device according to the embodiment of the present invention.

As shown in FIG. 11, the voltage of the selected word line WL2 during the period from time t3 to time t6 may be set to the same voltage of 6V, instead of the VCC, as the voltage of the unselected word line WL4. It is because, the channel is formed even if the threshold voltage of the selected memory cell is high, and also, because the bitline voltage can surely be transferred to those memory cells positioned at the side closer to the common source than the selected memory cell.

Figure 12:
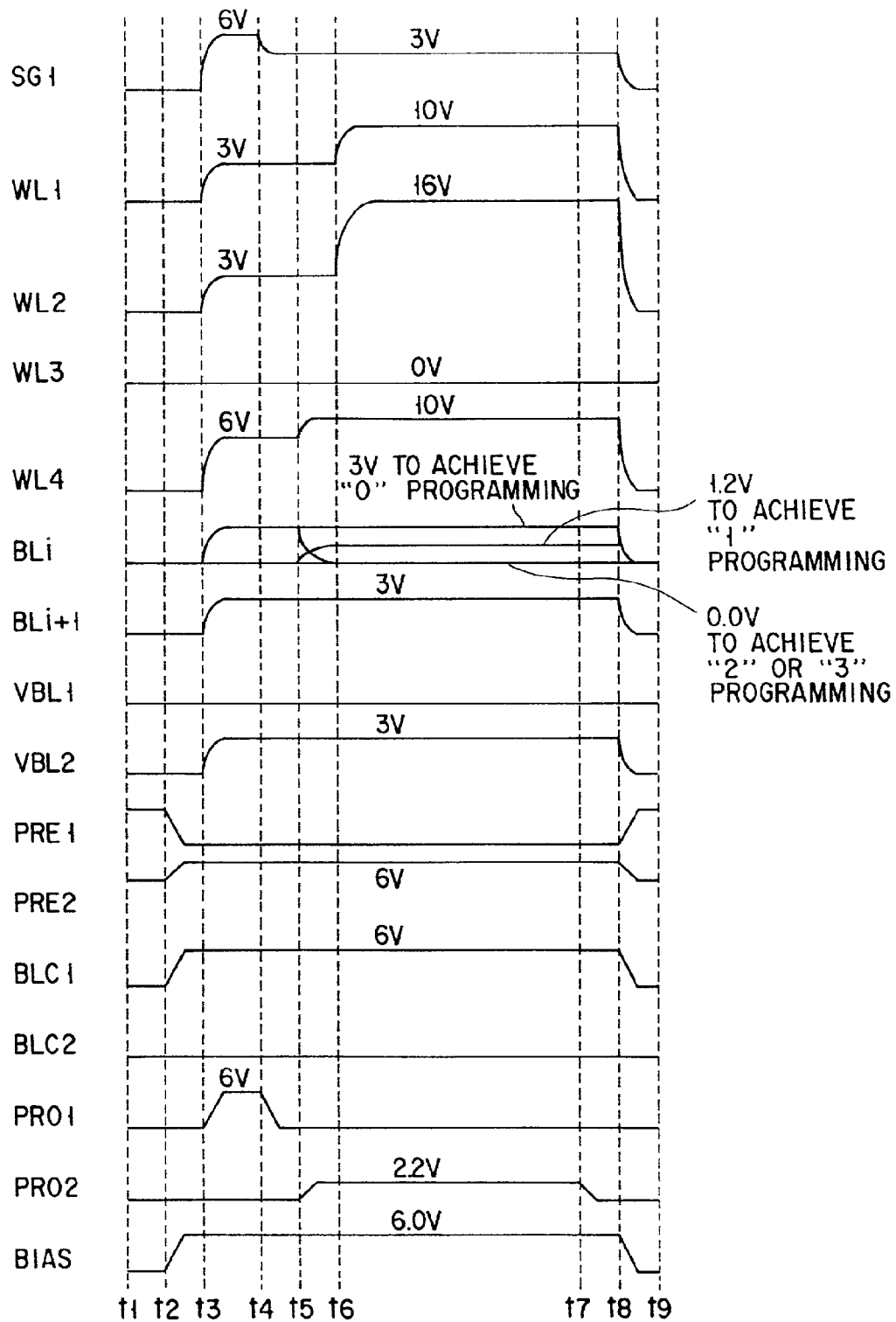
FIG. 12 is a schematic diagram showing a third programming operation of the semiconductor memory device according to the embodiment of the present invention.

FIG. 12 is a modification of the programming operation shown in FIG. 10. In this case, the timing at which the word line WL4 which is positioned at the side closer to the common source line than the selected word line WL2 and not adjacent to said selected word line WL2 is brought to 10V is selected at t5. This measure is taken to ensure that the memory cell which is positioned adjacent, at the side closer to the common source line, to the selected memory cell is brought into non-conductive state.

Figure 13:
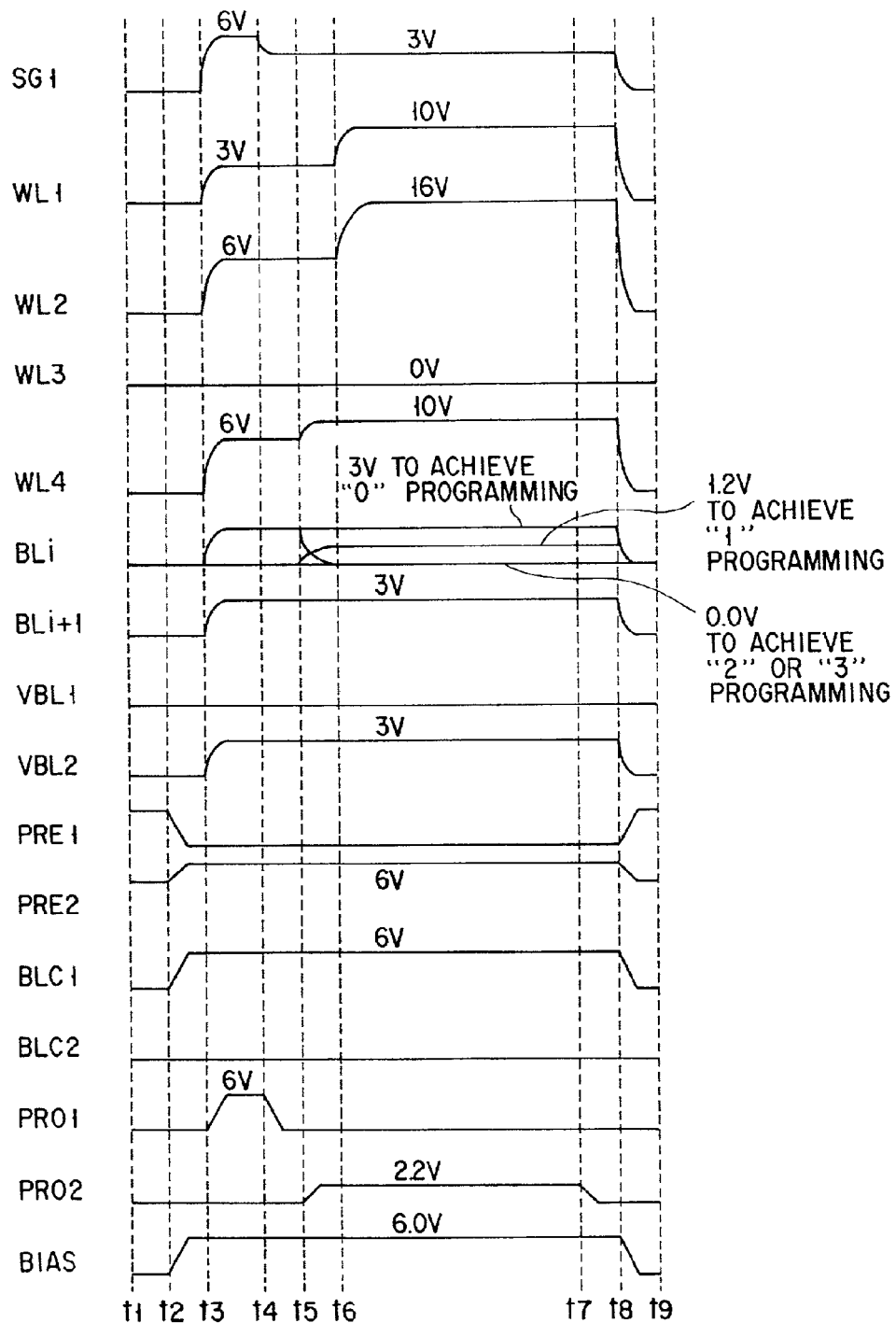
FIG. 13 is a schematic diagram showing a fourth programming operation of the semiconductor memory device according to the embodiment of the present invention.

FIG. 13 is a modification of the programming operation shown in FIG. 11. In this case, the timing at which the word line WL4 which is positioned at the side closer to the common source line WL2 than the selected word line WL2 and not adjacent to the selected word line WL2 is brought to 10V is set in t5. This measure is taken to ensure that the memory cell which is positioned adjacent, at the side closer to the common source line, to the selected memory cell is brought into non-conductive state.

Figure 14:
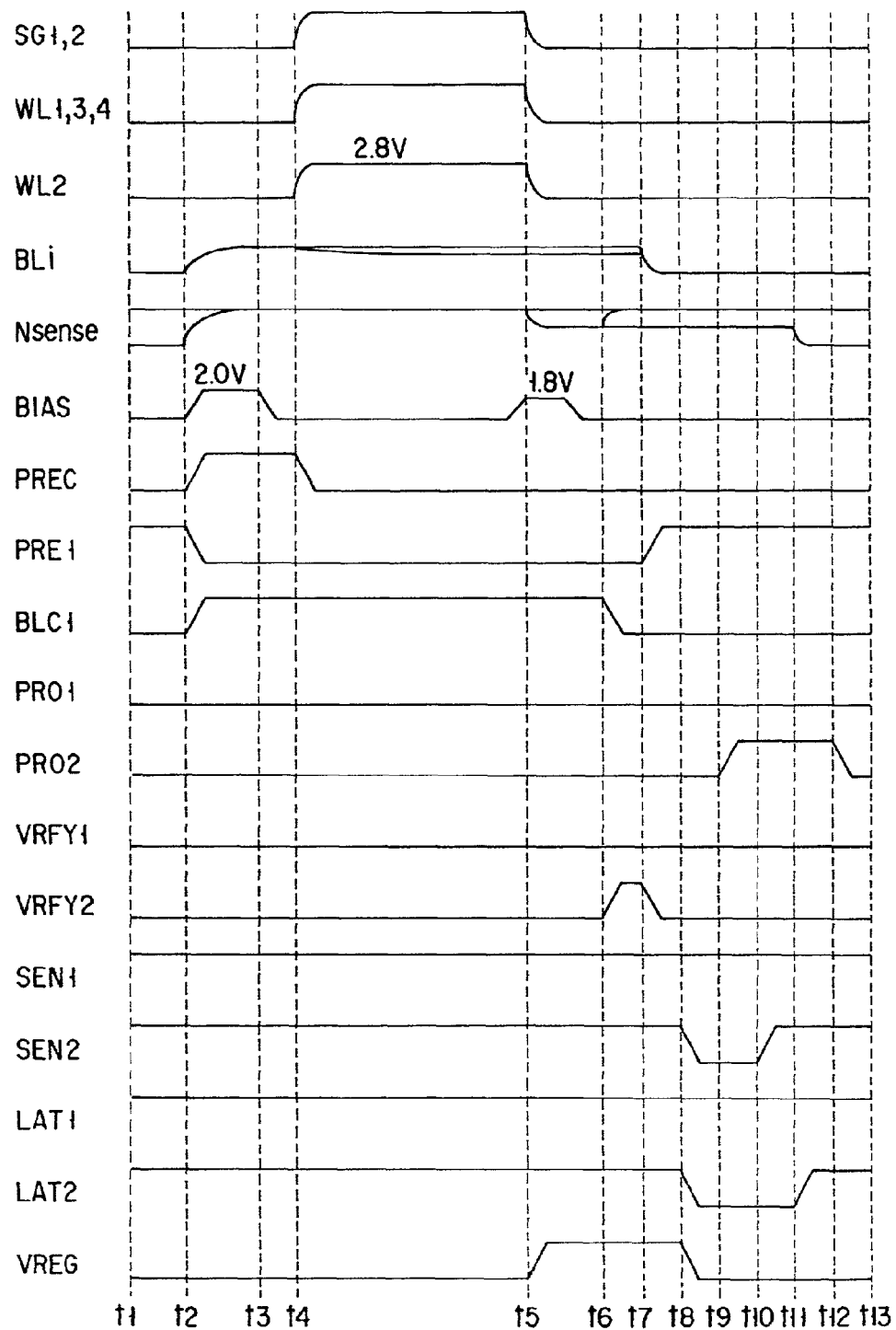
FIG. 14 is a programming verify operation of the semiconductor memory device according to the embodiment of the present invention.
Figure 15:
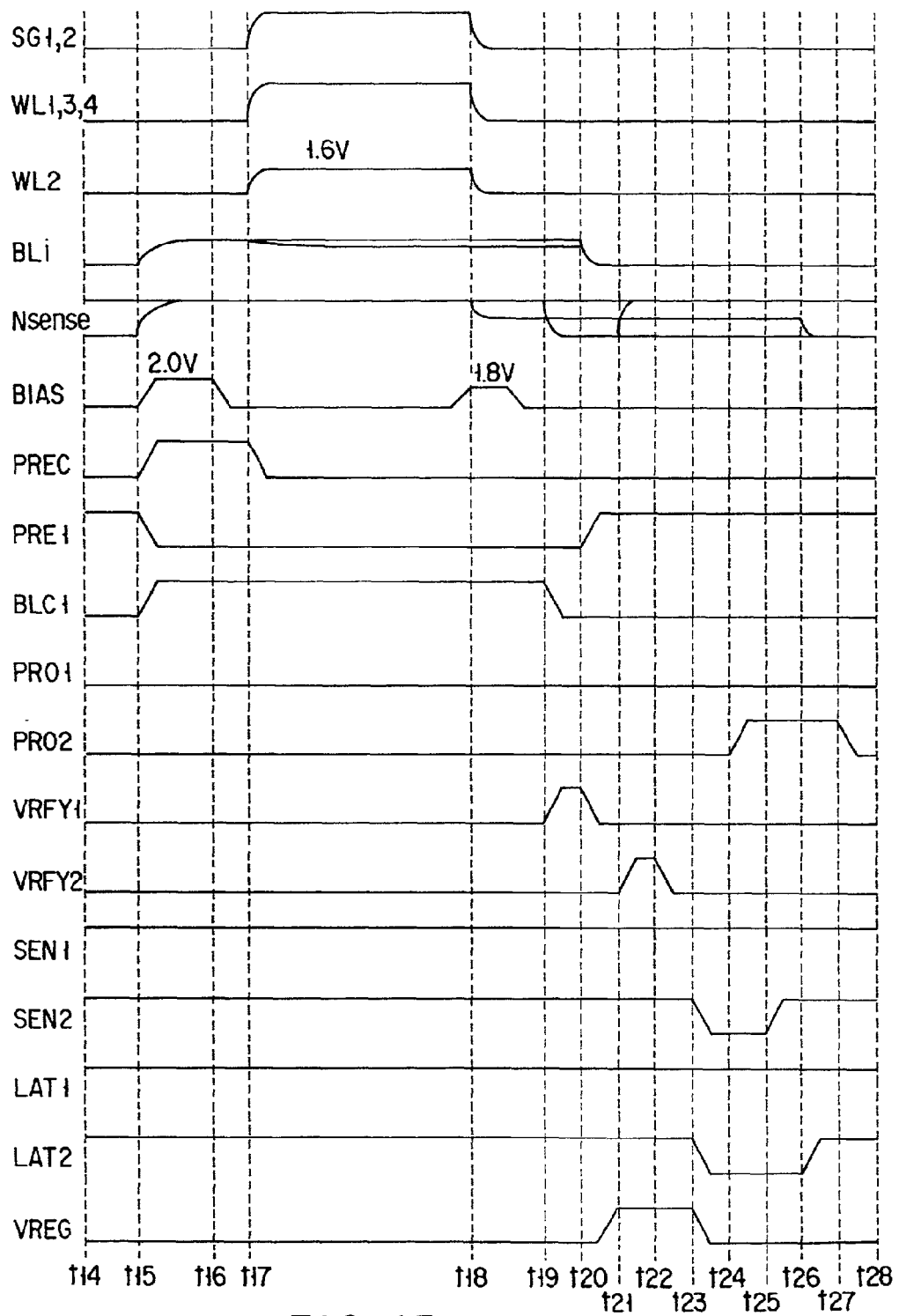
FIG. 15 is a schematic diagram showing the programming verify operation of the semiconductor memory device according to the embodiment of the present invention.
Figure 16:
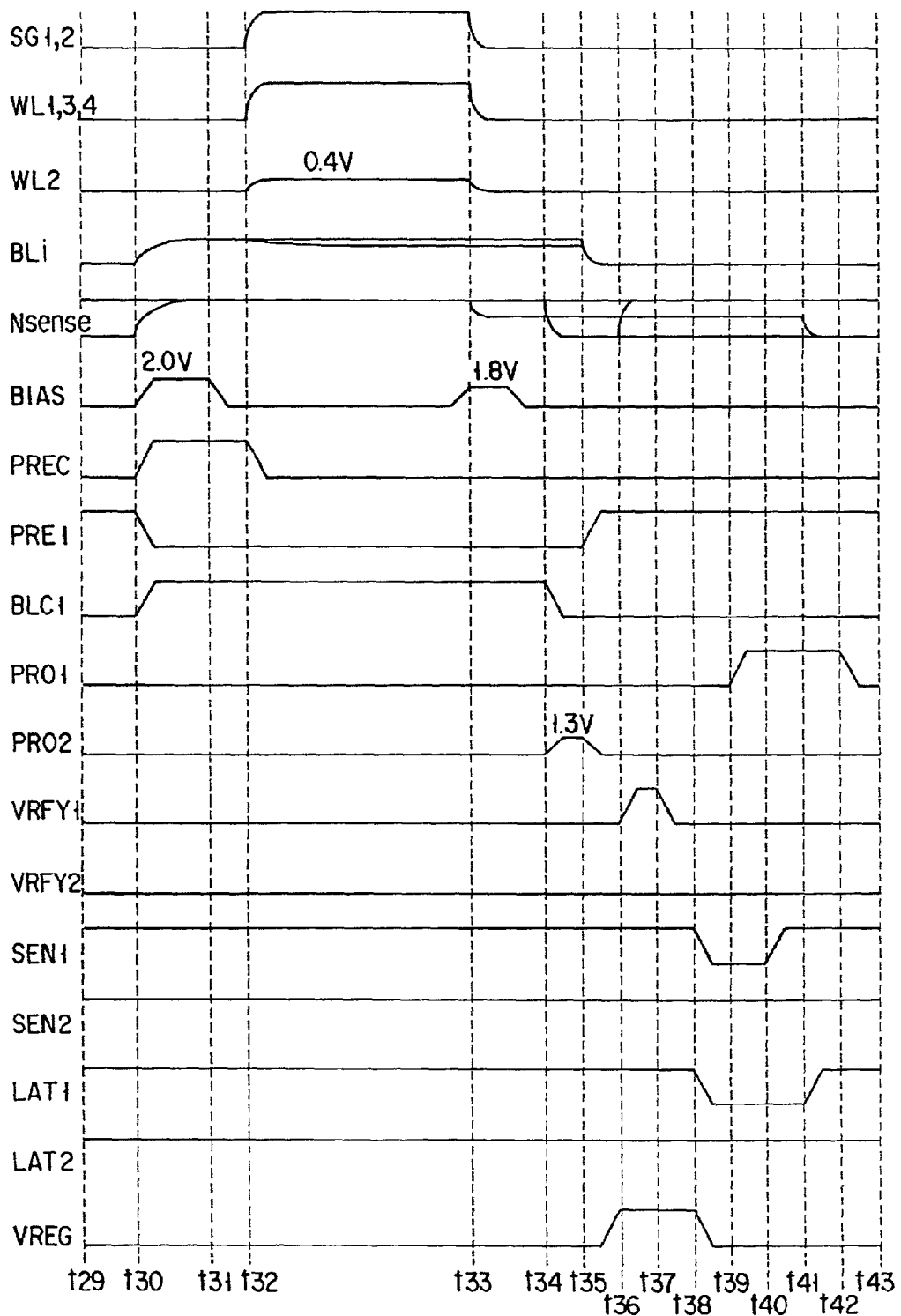
FIG. 16 is a schematic diagram showing the programming verify operation of the semiconductor memory device according to the embodiment of the present invention.

FIG. 14, FIG. 15 and FIG. 16 show the read verify operation for detecting the programmed state of the memory cell after the programming operation shown in FIG. 11, FIG. 12 or FIG. 13.

Here, there is shown the case where the bitlines BL0, BL2, ..., BLi, ..., BL4222 are selected (BLi being shown as the representative for them), and the word line WL2 is selected. Here, the four-level memory is employed by way of example. If the memory levels are limited to three levels, three-level memory can be easily effected.

Further, the voltages VBL1 and VBL2 remain at 0V, the signal BLC2 remains in "L" level, the signal PRE2 remains in "H" level, and the bitline BLi+1 remains in "L" level, so that they are not shown in FIGS. 14 to 16. Further, the signal PRST remains in "L" level, the signal CSLi remains in "L" level, the signal CSLi+1 remains in "L" level, so that they are not shown in FIGS. 14 to 16.

First, the signal PRE1 becomes "L" level, and the signal BLC1 becomes "H" level, whereby the bitline BLi is selected. The signal PREC becomes the VCC and the signal BIAS becomes 2V, whereby the bitline BLi is charged to 1V (t2). The signal BIAS becomes 0V, with which the charging of the bitline BLi is completed (t3).

Subsequently, the signal PREC becomes 0V, with which the charging of the node Nsense is completed (t4). The select gates SG1 and SG2 and the unselected word lines WL1, WL3 and WL4 are set to 4V, and the selected word line WL2 is set to 2.8V (t4)

When the voltage of the selected word line WL2 becomes 2.8V, the bitline BLi remains at 1V if the memory cell corresponding to the data memory circuit which stores the control data of "3" has reached the state in which said memory cell stores the "3" data.

If the memory cell corresponding to the data memory circuit which stores the control data of "3" has not reached the state in which said memory cell stores the "3" data, the voltage of the bitline BLi becomes 0.7V or less.

The memory cell corresponding to the data memory circuit which stores the control data of "2" or "1" has not reached the state in which said memory cell stores the "3" data, so that the voltage of the bitline BLi becomes 0.7 or less.

After the lapse of a predetermined period of time (t4 to t5), the signal BIAS is set to 1.8V. If the memory cell corresponding to the data memory circuit which stores the control data of "3" has reached the state in which said memory cell stores the "3" data, the node Nsense remains at 2V. If said memory cell is not in the state in which it stores the "3" data, then the voltage at the node Nsense is changed to 0.8 or less.

After the signal BIAS becomes 0V again to disconnect the bitline BLi from the node Nsense, the signal VRFY2 becomes the VCC (t6). Only in case the second sub-data in the second sub-data circuit is "0", the voltage at the node Nsense is changed to 2V by the n-channel MOS transistors Qn11 and Qn12. The voltage VREG is then VCC (t5 to t8).

The signals SEN2 and LAT2 become "L" level, whereby the clock synchronous inverters CI3 and CI4 are deactivated (t8). The signal PRO2 becomes "H" level (t9), and, when the signal SEN2 becomes "H" level (t10), the clock synchronous inverter CI3 is activated, so that the voltage at the node Nsense is sensed.

When the signal LAT2 becomes "H" level (t11), the clock synchronous inverter CI4 is activated, whereby the logic level of the sensed signal is latched.

The select gates SG1 and SG2 and the word lines WL1 to WL4 are reset to 0V at time t5. The signal BLC1 becomes "L" level at time t6, and the signal PRE1 becomes "H" level at time t7, so that the bitline BLi is reset to 0V at time t7.

The signal PRO2 becomes "L" level, with which the operation of detecting whether the memory cell corresponding to the data memory circuit 10 which stores the control data of "3" has reached the state in which said memory cell stores the "3" data (verify read of the data "3") is completed.

At this point of time, only in case it is detected that the memory cell corresponding to the data memory circuit which stores the control data of "3" has reached the state in which said memory cell stores the "3" data, the control data in the data memory circuit which stores the control data of "3" is changed to the "0" data, but, in other cases, the control data is retained (not changed).

Subsequently started is the operation of detecting whether the memory cell corresponding to the data memory circuit which stores the control data of "2" has reached the state in which said memory cell stores the "2" data.

First, the signal PRE1 becomes "L" level, and the BLC1 becomes "H" level, whereby the bitline BLi is selected. The signal PREC becomes the VCC, and the signal BIAS becomes 2V, whereby the bitline BLi is charged to 1V (t15). The signal BIAS becomes 0V, with which the charging of the bitline BLi is completed (t16).

Subsequently, the signal PREC becomes 0V, with which the charging of the node Nsense is completed (t17). The voltages at the select gates SG1 and SG2 and the unselected word lines WL1, WL3 and WL4 are set to 4V, and the selected word line WL2 is set to 1.6V (t17).

When the voltage of the selected word line WL2 becomes 1.6V, the bitline BLi remains at 1V if the memory cell corresponding to the data memory circuit which stores the control data of "2" has reached the state in which said memory cell stores the "2" data. If the memory cell corresponding to the data memory circuit which stores the control data of "2" has not reached the state in which said memory cell stores the "2" data, the voltage of the bitline BLi becomes 0.7V or less.

The memory cell corresponding to the data memory circuit which stores the control data of "1" has not reached the state in which said memory cell stores the "2" data, so that the voltage of the bitline BLi becomes 0.7V or less. After the lapse of a predetermined time (t7 to t18), the signal BIAS is changed to 1.8V. If the memory cell corresponding to the data memory circuit which stores the control data of "2" has reaches the state in which said memory cell stores the "2" data, then the node Nsense remains at 2V.

If the memory cell corresponding to the data memory circuit which stores the control data of "2" has not reached the state in which said memory cell stores the "2" data, then the voltage at the node Nsense becomes 0.8V or less. The memory cell corresponding to the data memory circuit which stores the control data of "1" has not reached the state in which said memory cell stores the "2" data, so that the voltage at the node Nsense becomes 0.8V or less.

After the signal BIAS becomes 0V again to disconnect the bitline BLi from the node Nsense, the signal VRFY1 becomes the VCC (t19). At this time, the voltage VREG is 0V, so that, when the first sub-data is "0", the voltage at the node Nsense is brought to 0V by the n-channel MOS transistors Qn5 and Qn6.

After this, the signal VRFY2 becomes the VCC (t21). Only in case the second sub-data in the second sub-data circuit is "0", the voltage at the node Nsense is set to 2V by the n-channel MOS transistors Qn11 and Qn12. At this time, the voltage VREG is at the VCC (t21 to t23).

The signals SEN2 and LAT2 become "L" level, whereby the clock synchronous inverters CI3 and CI4 are deactivated (t23). The signal PRO2 becomes "H" level (t24), and, when the signal SEN2 becomes "H" level (t25), the clock synchronous inverter CI3 is activated, so that the voltage at the node Nsense is sensed. When the signal LAT2 becomes "H" level (t26), the clock synchronous inverter CI4 is activated, so that the logic level of the sensed signal is latched.

The select gates SG1 and SG2 and the word lines WL1 to WL4 are reset to 0V at time t18. The signal BLC1 becomes "L" level at time t19, and the signal PRE1 becomes "H" level at time t20, so that the bitline BLi is reset to 0V at time t20.

The signal PRO2 becomes "L" level (t27), with which the operation of detecting whether the memory cell corresponding to the data memory circuit which stores the control data of "2" has reached the state in which said memory cell stores the "2" data (the verify reading of the data "2") is completed.

At this point of time, in case it is detected that the memory cell corresponding to the data memory circuit which stores the control data of "3" has reached the state in which said memory cell stores the "3" data, the control data in the data memory circuit 10 is already changed to the "0" data.

Only in case it is detected that the memory cell corresponding to the data memory circuit which stores the control data of "2" has reached the state in which said memory cell stores the "2" data, the control data in the data memory circuit 10 is already changed to the "1" data. In other cases, the control data is retained (not changed).

Subsequently started is the operation of detecting whether or not the memory cell corresponding to the data memory circuit which stores the control data of "1" has reached the state in which said memory cell stores the "1" data.

First, the signal PRE1 becomes "L" level, and the BLC1 becomes "H" level, whereby the bitline BLi is selected. The signal PREC becomes the VCC, and the signal BIAS becomes 2V, whereby the bitline BLi is charged to 1V (t30). The signal BIAS becomes 0V, with which the charging of the bitline BLi is completed (t31).

Subsequently, the signal PREC becomes 0V, with which the charging of the node Nsense is completed (t32). The voltages at the select gates SG1 and SG2 and the unselected word lines WL1, WL3 and WL4 are set to 4V, and the selected word line WL2 is set to 0.4V (t32).

When the voltage of the selected word line WL2 becomes 0.4V, the bitline BLi remains at 1V if the memory cell corresponding to the data memory circuit which stores the control data of "1" has reached the state in which said memory cell stores the "1" data. If the memory cell corresponding to the data memory circuit which stores the control data of "1" has not reached the state in which said memory cell stores the "1" data, the voltage of the bitline BLi becomes 0.7V or less.

After the lapse of a predetermined time (t17 to t18), the signal BIAS is set to 1.8V. If the memory cell corresponding to the data memory circuit which stores the control data of "1" has reached the state in which said memory cell stores the "1" data, then the node Nsense remains at 2V.

If the memory cell corresponding to the data memory circuit which stores the control data of "1" has not reached the state in which said memory cell stores the "1" data, the voltage at the node Nsense becomes 0.8V or less. After the signal BIAS becomes 0V again to disconnect the bitline BLi from the node Nsense, the signal PRO2 becomes 1.3V (t34).

At this time, in case the second sub-data is "1", the voltage at the node Nsense is changed to 0V by the n-channel MOS transistor Qn10. At this time, if the second sub-data is "0", the voltage at the node Nsense is brought only to 0.3V by the n-channel MOS transistor Qn10.

Originally, in case the voltage at the node Nsense is 0.3V or more, the n-channel MOS transistor Qn10 is non-conducting, so that the voltage at the node Nsense does not change. After this, the signal VRFY1 becomes the VCC (t36). Only in case the first sub-data in the first sub-data circuit is "0", the voltage at the node Nsense is changed to 2V by the n-channel MOS transistors Qn5 and Qn6. At this time, the voltage VREG is the VCC (t36 to t38).

The signals SEN1 and LAT 1 become "L" level, whereby the clock synchronous inverters CI1 and CI2 are deactivated (t38). The signal PRO1 becomes "H" level (t39), and, when the signal SEN1 becomes "H" level (t40), the clock synchronous inverter CI1 is activated, so that the voltage at the node Nsense is sensed.

When the signal LAT1 becomes "H" level (t41), the clock synchronous inverter CI2 is activated, so that the logic level of the sensed signal is latched.

The select gates SG1 and SG2 and the word lines WL1 to WL4 are reset to 0V at time t33. The signal BLC1 becomes "L" level at time t34. The signal BLC1 becomes "L" level at time t34, and the signal PRE1 becomes "H" level at time t35, so that the bitline BLi is reset to 0V at time t35.

The signal PRO1 becomes "L" level (t42), with which the operation of detecting whether or not the memory cell corresponding to the data memory circuit which stores the control data of "1" has reached the state in which said memory cell stores the "1" data (the verify reading of the data "1") is completed.

At this point of time, only in case it is detected that the memory cell corresponding to the data memory circuit which stores the control data of "3" has reached the state in which said memory cell stores the "3" data, in case it is detected that the memory cell corresponding to the data memory circuit which stores the control data of "2" has reached the state in which said memory cell stores the "2" data, and in case it is detected that the memory cell corresponding to the data memory circuit which stores the control data of "1" has reached the state in which said memory cell stores the "1" data, the control data in the data memory circuit 10 is changed to the "0" data, and, in other cases, the control data is retained (not changed).

The programming verify operation is carried out in the order shown in FIG. 14, FIG. 15 and FIG. 16.

By the programming verify operation, the control data stored in the data memory circuit 10 are changed as shown in Table 4 from the programmed state of the memory cell.

TABLE 4

| PROGRAMMED STATE OF MEMORY CELL | CONTROL DATA BEFORE PROGRAMMING VERIFY | CONTROL DATA AFTER PROGRAMMING VERIFY |
| --- | --- | --- |
| 0, 1, 2, or 3 | 0 | 0 |
| Less than 1 | 1 | 1 |
| 1 | 1 | 0 |
| Less than 2 | 2 | 2 |
| 2 | 2 | 0 |
| Less than 3 | 3 | 3 |
| 3 | 3 | 0 |

The programming operation shown in FIG. 10, FIG. 11, FIG. 12 or FIG. 13 and the programming verify operation shown in FIGS. 14 to 16 are repeatedly carried out until all the control data become "0", and thus, the data programming into the memory cell M is performed. Whether or not the all the control data have become "0" is found by detecting whether or not the signal PT is conducting to the ground level.

That is, the semiconductor memory device according to the present invention comprises memory cells M, bitlines BL connected to the memory cells M, MIS transistors Qn14 which each have a gate electrode, a source electrode and a drain electrode and are each connected to a bitline at the source electrode thereof, and switch elements Qn13 connected to said drain electrode, wherein the respective bitline BL is charged when the switch element Qn13 conducts and a first voltage is applied to the gate electrode of the MIS transistor Qn14; and thereafter, the voltage at the gate electrode is changed to a second voltage different from the first voltage, amplifying the voltage of the bitline BL which varies in accordance with the data in the memory cell M.

As preferred embodiments of the present invention, the following embodiments are pointed:

The switch element Qn13 is made non-conductive while the second voltage is being applied to the gate electrode of the MIS transistor Qn14. The MIS transistor Qn14 is an n-channel MIS transistor, wherein the first voltage is higher than the second voltage. The electrostatic capacitance of the respective bitline BL is higher than the electrostatic capacitance coupled to the drain electrode.

Another semiconductor memory device according to the present invention comprises NAND memory cell units which are each arranged in such a manner that a predetermined number of memory cells M each having the MIS transistor structure are connected in series between a first and second select transistors S each having the MIS transistor structure, wherein a first voltage is applied to the gate electrode of the selected memory cell M; a second voltage is applied to the gate electrodes of the memory cells M which are positioned adjacent, at the side closer to the second select transistor, to the selected memory cell M; and a third voltage is applied to the gate electrodes of the remaining memory cells M, whereby programming or programming is performed, wherein the first voltage is higher than the third voltage, and the third voltage is set to a value higher than the second voltage.

As further preferred embodiments of the present invention, the following embodiments are pointed out:

(1) The first select transistor S is connected to a bitline BL, and the second select transistor S is connected to a source line SRC. Programming is successively carried out into the memory cells in the order starting from the memory cell adjacent to the second transistor S and ending at the memory cell adjacent to the first transistor S.

(2) To the gate electrodes of those memory cells M—of the remaining memory cells M—which are positioned closer to the second select transistor S with reference to the selected memory cell M, a fourth voltage is applied, and, to the gate electrodes of those memory cells M—of the remaining memory cells M—which are positioned closer to the first select transistor S with reference to the select memory cell M, a fifth voltage is applied; the channels of the memory cells are thus previously charged and then the programming is carried out.

(3) To the gate electrodes of those memory cells M—of the remaining memory cells M—which are positioned closer to the second select transistor S with reference to the selected memory cell M, a fourth voltage is applied, and, to the gate electrodes of those memory cells M—of the remaining memory cells M—which are positioned closer to the first select transistor S with reference to the selected memory cell M, a fifth voltage is applied, and to the gate electrode of the selected memory cell M, the fourth voltage is applied; the channels of the memory cells M are thus previously charged, and then the programming is carried out.

(4) To the gate electrodes of those memory cells M—of the remaining memory cells M—which are positioned closer to the second select transistor S with reference to the selected memory cell M, a fourth voltage is applied, and, to the gate electrodes of those memory cells M—of the remaining memory cells M—which are positioned closer to the first select transistor S with reference to the selected memory cell M, a fifth voltage is applied, and to the gate cell of the selected memory cell M, the fifth voltage is applied; the channels of the memory cells M are thus previously charged, and then the programming is carried out.

(5) The memory cells M each have the n-channel MIS transistor structure. The fourth and fifth voltages are lower than the third voltage, and the fourth voltage is higher than the fifth voltage.

(6) To the gate electrodes of those memory cells M—of the remaining memory cells M—which are positioned closer to the second select transistor S with reference to the selected memory cell M, a third voltage is applied, and thereafter, to the gate electrodes of those memory cells M—of the remaining memory cells M—which are positioned closer to the first select transistor S with reference to the selected memory cell M, the third voltage is applied.

(7) To the gate electrodes of those memory cells M—of the remaining memory cells M—which are positioned closer to the second select transistor S with reference to the selected memory cell, the third voltage is applied, and thereafter, to the gate electrodes of those memory cells M—of the remaining memory cells M—which are positioned closer to the first select transistor S with reference to the select memory cell M, the third voltage is applied, and, to the gate electrode of the selected memory cell M, the first voltage is applied.

In this way, in the semiconductor memory device according to the present invention, the channel voltage of the memory cell when the "0" data is programmed is generated without depending on the threshold voltage of the memory cell in which the data has been programmed. As a result, there can be realized a semiconductor memory device in which the channel voltage of the memory cell when the "0" data is programmed can be generated with sufficient stability.

Further, in the semiconductor memory device according to the present invention, after the bitline is charged by a MOS transistor, the gate electrode of said MOS transistor is changed, whereby it is ensured that, after the bitline is charged, the MOS transistor can be brought into non-conduction in a short time. Thus, according to the present invention, there can be realized a semiconductor memory device in which the programmed state of the memory cell can be detected at high speed and with high accuracy.

The present invention is not limited only to the above-described embodiments but can be variously modified without departure from the technical scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

The invention claimed is:

1. A semiconductor memory device comprising:
   a memory cell unit having a plurality of memory cells connected in series, a first select transistor and a second select transistor, the plurality of memory cells being located between the first select transistor and the second select transistor, the memory cell unit being arranged in an array form;
   a bit line, the first select transistor being located between the bit line and the plurality of memory cells; and
   a programming circuit for programming into a selected memory cell among the plurality of memory cells in a selected memory cell unit;
   wherein at a time of programming, the programming circuit applies a first voltage to a gate electrode of the selected memory cell, applies a second voltage to a gate electrode of a first memory cell located between the selected memory cell and the first select transistor, applies a third voltage to a gate electrode of a second memory cell located between the selected memory cell and the second select transistor, applies a fourth voltage to a gate electrode of a third memory cell located between the selected memory cell and the second select transistor, the third memory cell being different from the second memory cell, and applies a fifth voltage to a gate electrode of the first select transistor; and wherein all of the selected memory cell, the first memory cell, the second memory cell and the third memory cell are included in the selected memory cell unit, the first voltage is higher than both the second voltage and the fourth voltage, both the second voltage and the fourth voltage are higher than the third voltage and higher than the fifth voltage, and when the first voltage is applied to the gate electrode of the selected memory cell, the third voltage is lower than a voltage applied to a memory cell located between the select memory cell and the first select transistor and adjacent to the selected memory cell.

2. The semiconductor memory device according to claim 1, wherein when the first voltage is applied to the gate electrode of the selected memory cell, the fifth voltage is lower than a voltage applied to a memory cell located between the select memory cell and the first select transistor and adjacent to the selected memory cell.

3. The semiconductor memory device according to claim 1, wherein when the first voltage is applied to the gate electrode of the selected memory cell, the third voltage is lower than all voltages applied to gate electrodes of all memory cells located between the selected memory cell and the first select transistor in the selected memory cell unit.

4. The semiconductor memory device according to claim 1, wherein when the first voltage is applied to the gate electrode of the selected memory cell, a sixth voltage is applied to the gate electrode of the second select transistor, the fifth voltage is higher than the sixth voltage.

5. The semiconductor memory device according to claim 1, wherein when the first voltage is applied to the gate electrode of the selected memory cell, the third voltage is lower than all voltages applied to gate electrodes of all memory cells other than the second memory cell in the selected memory cell unit.

6. The semiconductor memory device according to claim 1, wherein the first memory cell is located adjacent to the selected memory cell.

7. The semiconductor memory device according to claim 1, wherein the third memory cell is located between the second memory cell and the second select transistor.

8. The semiconductor memory device according to claim 1, wherein the memory cell is capable of storing multi-bit data which is more than one bit data.

9. The semiconductor memory device according to claim 1, further comprising a source line, wherein the second transistor is located between the source line and the plurality of memory cells.

10. The semiconductor memory device according to claim 1, wherein when the first voltage is applied to the gate electrode of the selected memory cell, the fifth voltage is lower than all voltages applied to gate electrodes of all memory cells located between the selected memory cell and the first select transistor in the selected memory cell unit.

11. The semiconductor memory device according to claim 1, wherein when the first voltage is applied to the gate electrode of the selected memory cell, a sixth voltage is applied to the gate electrode of the second select transistor, the sixth voltage is lower than a voltage applied to a memory cell located between the select memory cell and the first select transistor and adjacent to the selected memory cell.

12. The semiconductor memory device according to claim 1, wherein when the first voltage is applied to the gate electrode of the selected memory cell, a highest voltage in voltages applied to a plurality of the bit lines is lower than a voltage applied to a memory cell located between the select memory cell and the first select transistor and adjacent to the selected memory cell.

13. The semiconductor memory device according to claim 1, wherein when the first voltage is applied to the gate electrode of the selected memory cell, the fifth voltage is higher than the third voltage.

14. The semiconductor memory device according to claim 1, wherein when the first voltage is applied to the gate electrode of the selected memory cell, a sixth voltage, a seventh voltage and a eighth voltage are simultaneously applied to a plurality of the bit lines, and the sixth voltage, the seventh voltage and the eighth voltage are different from one another.

15. The semiconductor memory device according to claim 1, wherein when the first voltage is applied to the gate electrode of the selected memory cell, a lowest voltage in voltages applied to a plurality of the bit lines is lower than the fifth voltage.

16. The semiconductor memory device according to claim 1, wherein a sixth voltage is applied to the gate electrode of the first select transistor in a first period, a seventh voltage is applied to the gate electrode of the first select transistor in a second period after the first period, the fifth voltage and the first voltage are respectively applied to the gate electrodes of the first select transistor and the selected memory cell in a third period after the second period, the fifth voltage is higher than the sixth voltage, the fifth voltage is lower than the seventh voltage, and the seventh voltage is lower than the first voltage.

17. A semiconductor memory device comprising:
a memory cell unit having a plurality of memory cells connected in series, a first select transistor and a second select transistor, the plurality of memory cells being located between the first select transistor and the second select transistor, the memory cell unit being arranged in an array form;
a bit line, the first select transistor being located between the bit line and the plurality of memory cells; and
a programming circuit for programming into a selected memory cell among the plurality of memory cells in a selected memory cell unit;
wherein at a time of programming, the programming circuit applies a first voltage to a gate electrode of the selected memory cell, applies a second voltage to a gate electrode of a first memory cell located between the selected memory cell and the first select transistor, applies a third voltage to a gate electrode of a second memory cell located between the selected memory cell and the second select transistor, applies a fourth voltage to a gate electrode of a third memory cell located between the selected memory cell and the second select transistor, the third memory cell being different from the second memory cell, and applies a fifth voltage to a gate electrode of the first select transistor; and
wherein all of the selected memory cell, the first memory cell, the second memory cell and the third memory cell are included in the selected memory cell unit, the first voltage is higher than both the second voltage and the fourth voltage, both the second voltage and the fourth voltage are higher than the third voltage and higher than the fifth voltage, and when the first voltage is applied to the gate electrode of the selected memory cell, at least one of the third voltage and the fifth voltage is lower than a voltage applied to a memory cell located between the select memory cell and the first select transistor and adjacent to the selected memory cell.

18. A semiconductor memory device comprising:

a memory cell unit having a plurality of memory cells connected in series, a first select transistor and a second select transistor, the plurality of memory cells being located between the first select transistor and the second select transistor, the memory cell unit being arranged in an array form;

a bit line, the first select transistor being located between the bit line and the plurality of memory cells; and a programming circuit for programming into a selected memory cell among the plurality of memory cells in a selected memory cell unit;

wherein at a time of programming, the programming circuit applies a first voltage to a gate electrode of the selected memory cell, applies a second voltage to a gate electrode of a first memory cell located between the selected memory cell and the first select transistor, applies a third voltage to a gate electrode of a second memory cell located between the selected memory cell and the second select transistor, applies a fourth voltage to a gate electrode of a third memory cell located between the selected memory cell and the second select transistor, the third memory cell being different from the second memory cell, applies a fifth voltage to a gate electrode of the first select transistor, and applies a sixth voltage to a gate electrode of the second select transistor; and wherein all of the selected memory cell, the first memory cell, the second memory cell and the third memory cell are included in the selected memory cell unit, the first voltage is higher than both the second voltage and the fourth voltage, both the second voltage and the fourth voltage are higher than the third voltage and higher than the fifth voltage, and when the first voltage is applied to the gate electrode of the selected memory cell, the fifth voltage is lower than a voltage applied to a memory cell located between the select memory cell and the first select transistor and adjacent to the selected memory cell, the fifth voltage is higher than the sixth voltage, and when the first voltage is applied to the gate electrode of the selected memory cell, a lowest voltage in voltages applied to a plurality of the bit lines is lower than the fifth voltage.

19. The semiconductor memory device according to claim 18, wherein when the first voltage is applied to the gate electrode of the selected memory cell, the third voltage is lower than a voltage applied to a memory cell located between the select memory cell and the first select transistor and adjacent to the selected memory cell.

20. The semiconductor memory device according to claim 18, wherein when the first voltage is applied to the gate electrode of the selected memory cell, the third voltage is lower than all voltages applied to gate electrodes of all memory cells located between the selected memory cell and the first select transistor in the selected memory cell unit.

21. The semiconductor memory device according to claim 18, wherein when the first voltage is applied to the gate electrode of the selected memory cell, the third voltage is lower than all voltages applied to gate electrodes of all memory cells other than the second memory cell in the selected memory cell unit.

22. The semiconductor memory device according to claim 18, wherein the first memory cell is located adjacent to the selected memory cell.

23. The semiconductor memory device according to claim 18, wherein the third memory cell is located between the second memory cell and the second select transistor.

24. The semiconductor memory device according to claim 18, wherein the memory cell is capable of storing multi-bit data which is more than one bit data.

25. The semiconductor memory device according to claim 18, further comprising: a source line, wherein the second transistor is located between the source line and the plurality of memory cells.

26. The semiconductor memory device according to claim 18, wherein when the first voltage is applied to the gate electrode of the selected memory cell, the fifth voltage is lower than all voltages applied to gate electrodes of all memory cells located between the selected memory cell and the first select transistor in the selected memory cell unit.

27. The semiconductor memory device according to claim 18, wherein when the first voltage is applied to the gate electrode of the selected memory cell, a highest voltage in voltages applied to a plurality of the bit lines is lower than a voltage applied to a memory cell located between the select memory cell and the first select transistor and adjacent to the selected memory cell.

28. The semiconductor memory device according to claim 18, wherein when the first voltage is applied to the gate electrode of the selected memory cell, the fifth voltage is higher than the third voltage.

29. The semiconductor memory device according to claim 18, wherein when the first voltage is applied to the gate electrode of the selected memory cell, a seventh voltage, an eighth voltage and a ninth voltage are simultaneously applied to a plurality of the bit lines, and the seventh voltage, the eighth voltage and the ninth voltage are different from one another.

30. The semiconductor memory device according to claim 18, wherein a seventh voltage is applied to the gate electrode of the first select transistor in a first period, an eighth voltage is applied to the gate electrode of the first select transistor in a second period after the first period, the fifth voltage and the first voltage are respectively applied to the gate electrodes of the first select transistor and the selected memory cell in a third period after the second period, the fifth voltage is higher than the seventh voltage, the fifth voltage is lower than the eighth voltage, and the eighth voltage is lower than the first voltage.

* * * * *